(12) United States Patent
Sasada

(10) Patent No.: US 12,397,532 B2
(45) Date of Patent: Aug. 26, 2025

(54) FILM AND LAMINATE

(71) Applicant: FUJIFILM Corporation, Tokyo (JP)

(72) Inventor: Yasuyuki Sasada, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 144 days.

(21) Appl. No.: 18/318,696

(22) Filed: May 16, 2023

(65) Prior Publication Data

US 2023/0286250 A1 Sep. 14, 2023

Related U.S. Application Data

(63) Continuation of application No. PCT/JP2021/042880, filed on Nov. 24, 2021.

(30) Foreign Application Priority Data

| Nov. 24, 2020 | (JP) | 2020-194673 |
| Sep. 10, 2021 | (JP) | 2021-148181 |
| Nov. 19, 2021 | (JP) | 2021-188871 |

(51) Int. Cl.
*B32B 15/09* (2006.01)
*B32B 15/20* (2006.01)
*B32B 27/20* (2006.01)

(52) U.S. Cl.
CPC ............ *B32B 15/09* (2013.01); *B32B 15/20* (2013.01); *B32B 27/20* (2013.01); *B32B 2250/03* (2013.01); *B32B 2250/40* (2013.01); *B32B 2305/55* (2013.01)

(58) Field of Classification Search
None
See application file for complete search history.

(56) References Cited

U.S. PATENT DOCUMENTS

| 5,843,501 | A | * | 12/1998 | Rubin | B32B 7/12 |
| | | | | | 206/524.1 |
| 2004/0124405 | A1 | * | 7/2004 | Sethumadhavan | C09K 19/54 |
| | | | | | 257/1 |
| 2014/0099452 | A1 | | 4/2014 | Kawanishi et al. | |
| 2020/0329558 | A1 | * | 10/2020 | Kasai | H05K 1/092 |

FOREIGN PATENT DOCUMENTS

| JP | H11/198285 | A | * | 7/1999 | ............ B29C 41/32 |
| JP | H11198285 | | | 7/1999 | |
| JP | 2005539382 | | | 12/2005 | |
| JP | 2013046992 | | | 3/2013 | |
| JP | 2014237769 | | | 12/2014 | |
| JP | 2018186303 | | | 11/2018 | |
| JP | 2020026474 | | | 2/2020 | |
| JP | 2014237769 | A | * | 12/2021 | ............... C08J 7/00 |
| WO | 2017175649 | | | 10/2017 | |
| WO | WO-2017175649 | A1 | * | 10/2017 | ............ B32B 15/08 |
| WO | 2021251262 | | | 12/2021 | |

OTHER PUBLICATIONS

Tsujimoto—JP H11-198285 A—PCT D2—MT—cellulose w-variation in modulus w-position—1999 (Year: 1999).*
Eda—JP 2014-237769 A—PCT D3—MT—LCP film—2014 (Year: 2014).*
Fukutake—WO 2017-175649 A1—PCT D5—MT—LCP laminate—2017 (Year: 2017).*
"International Search Report (Form PCT/ISA/210) of PCT/JP2021/042880," mailed on Feb. 8, 2022, with English translation thereof, pp. 1-7.
"Written Opinion of the International Searching Authority (Form PCT/ISA/237) of PCT/JP2021/042880," mailed on Feb. 8, 2022, with English translation thereof, pp. 1-8.

* cited by examiner

*Primary Examiner* — John Vincent Lawler
(74) *Attorney, Agent, or Firm* — JCIPRNET

(57) ABSTRACT

Provided are a film capable of suppressing a distortion of a metal wire in a case where the film is adhered to the metal wire, and a laminate formed of the film. The film has a dielectric loss tangent of 0.005 or less, and has an elastic modulus of at least one surface at 160° C., which is smaller than an elastic modulus of an inside at 160° C.

18 Claims, No Drawings

FILM AND LAMINATE

CROSS-REFERENCE TO RELATED APPLICATIONS

This application is a continuation application of International Application No. PCT/JP2021/042880, filed Nov. 24, 2021, the disclosure of which is incorporated herein by reference in its entirety. Further, this application claims priority from Japanese Patent Application No. 2020-194673, filed Nov. 24, 2020, Japanese Patent Application No. 2021-148181, filed Sep. 10, 2021, and Japanese Patent Application No. 2021-188871, filed Nov. 19, 2021.

BACKGROUND OF THE INVENTION

1. Field of the Invention

The present disclosure relates to a film and a laminate.

2. Description of the Related Art

In recent years, frequencies used in a communication equipment tend to be extremely high. In order to suppress transmission loss in a high frequency band, insulating materials used in a circuit board are required to have a lowered relative permittivity and a lowered dielectric loss tangent.

In the related art, polyimide is commonly used as the insulating material used in the circuit board, a liquid crystal polymer which has high heat resistance and low water absorption and is small in loss in the high frequency band has been attracted.

As a liquid crystal polymer film in the related art, for example, JP2020-26474A discloses a liquid crystalline polyester film that contains at least liquid crystalline polyester, in which, in a case where a first alignment degree is set to an alignment degree with respect to a first direction parallel to a main surface of the liquid crystalline polyester film, and a second alignment degree is set to an alignment degree with respect to a second direction parallel to the main surface and perpendicular to the first direction, a first alignment degree/second alignment degree that is a ratio of the first alignment degree and the second alignment degree is equal to or greater than 0.95 and equal to or less than 1.04, and a third alignment degree of the liquid crystalline polyester that is measured by a wide angle X-ray scattering method in a direction parallel to the main surface is equal to or greater than 60.0%.

In addition, as a laminated film in the related art, for example, JP2013-46992A discloses a manufacturing method of a peelable laminated film which includes a layer A containing cellulose ester and a layer B containing a solution-forming resin different from the cellulose ester, in which an adhesion force between the layer A and the layer B is 5 N/cm or less, the manufacturing method including simultaneously or sequentially casting and laminating a dope A for forming the layer A, which contains at least the cellulose ester and a solvent, and a dope B for forming the layer B, which contains at least the solution-forming resin different from the cellulose ester and a solvent, on a casting support; peeling off a laminate of the dope A and the dope B from the casting support; and drying the laminate.

SUMMARY OF THE INVENTION

An object to be achieved by an aspect of the present invention is to provide a film capable of suppressing a distortion of a metal wire in a case where the film is adhered to the metal wire.

Further, an object to be achieved by another aspect of the present invention is to provide a laminate formed of the film.

The methods for achieving the above-described objects include the following aspects.

<1> A film that has a dielectric loss tangent of 0.005 or less, and has an elastic modulus of at least one surface at 160° C., which is smaller than an elastic modulus of an inside at 160° C.

<2> The film according to <1>,
in which a loss tangent of the surface at 160° C. is 0.03 or more.

<3> The film according to <1> or <2>,
in which the elastic modulus of the inside at 160° C. is 0.5 GPa or more.

<4> A film that has a dielectric loss tangent of 0.005 or less, and has an elastic modulus of at least one surface at 300° C., which is smaller than an elastic modulus of an inside at 300° C.

<5> The film according to <4>,
in which a loss tangent of the surface at 300° C. is 0.1 or more.

<6> The film according to <4> or <5>,
in which the elastic modulus of the inside at 300° C. is 0.1 GPa or more.

<7> The film according to any one of <1> to <6>,
in which a linear expansion coefficient is −20 ppm/K to 50 ppm/K.

<8> The film according to any one of <1> to <7>,
in which the film contains a filler.

<9> The film according to <8>,
in which a number density of the filler is higher in the inside than in the surface.

<10> The film according to any one of <1> to <9>,
in which the film contains at least one polymer selected from the group consisting of a liquid crystal polymer, a fluorine-based polymer, a polymerized substance of a compound which has a cyclic aliphatic hydrocarbon group and a group having an ethylenically unsaturated bond, a polyphenylene ether, and an aromatic polyether ketone.

<11> The film according to <10>,
in which the liquid crystal polymer has a constitutional unit represented by any of Formulae (1) to (3), $$-O-Ar^1-CO- \quad \text{Formula (1)}$$

$$-CO-Ar^2-CO- \quad \text{Formula (2)}$$

$$-X-Ar^3-Y- \quad \text{Formula (3)}$$

in Formulae (1) to (3), $Ar^1$ represents a phenylene group, a naphthylene group, or a biphenylylene group, $Ar^2$ and $Ar^3$ each independently represent a phenylene group, a naphthylene group, a biphenylylene group, or a group represented by Formula (4), X and Y each independently represent an oxygen atom or an imino group, and hydrogen atoms in $Ar^1$ to $Ar^3$ may be each independently substituted with a halogen atom, an alkyl group, or an aryl group, $$-Ar^4-Z-Ar^5- \quad \text{Formula (4)}$$

in Formula (4), $Ar^4$ and $Ar^5$ each independently represent a phenylene group or a naphthylene group, and Z represents an oxygen atom, a sulfur atom, a carbonyl group, a sulfonyl group, or an alkylene group.

<12> A film that has a dielectric loss tangent of 0.010 or less, and has an elastic modulus of at least one surface at 160° C., which is smaller than an elastic modulus of an inside at 160° C.

<13> A film that has a dielectric loss tangent of 0.010 or less, and has an elastic modulus of at least one surface at 300° C., which is smaller than an elastic modulus of an inside at 300° C.

<14> The film according to any one of <1> to <3>, and <7> to <12>, in which the film includes a layer A and a layer B provided on at least one surface of the layer A, and an elastic modulus of a surface of the layer B at 160° C. is smaller than the elastic modulus of the inside at 160° C.

<15> The film according to any one of <4> to <11>, and <13>, in which the film includes a layer A and a layer B provided on at least one surface of the layer A, and an elastic modulus of a surface of the layer B at 300° C. is smaller than the elastic modulus of the inside at 300° C.

<16> The film according to <14> or <15>, in which the film further includes a layer C, and the layer B, the layer A, and the layer C are provided in this order.

<17> A laminate comprising:

the film according to <14> or <15>; and a metal layer disposed on a surface of the layer A side in the film.

<18> A laminate comprising:

the film according to any one of <14> to <16>; and a metal layer disposed on a surface of the layer B side in the film.

<19> A laminate comprising:

the film according to <16>;

a metal layer disposed on a surface of the layer B side in the film; and a metal layer disposed on a surface of the layer C side in the film.

<20> The laminate according to <18> or <19>, in which the metal layer disposed on the surface of the layer B side is a copper layer disposed on the surface of the layer B, and a peel strength between the layer B and the copper layer is 0.5 kN/m or more.

<21> The laminate according to <19>, in which the metal layer disposed on the surface of the layer C side is a copper layer disposed on the surface of the layer C, and a peel strength between the layer C and the copper layer disposed on the surface of the layer C side is 0.5 kN/m or more.

<22> The laminate according to any one of <17> to <21>, in which a thickness of the layer B is larger than a thickness of the metal layer.

According to the aspect of the present invention, it is possible to provide a film capable of suppressing a distortion of a metal wire in a case where the film is adhered to the metal wire.

Further, according to another aspect of the present invention, it is possible to provide a laminate formed of the film.

DESCRIPTION OF THE PREFERRED EMBODIMENTS

Hereinafter, the contents of the present disclosure will be described in detail. The description of configuration requirements below is made based on representative embodiments of the present disclosure in some cases, but the present disclosure is not limited to such embodiments.

Further, in the present specification, a numerical range shown using "to" indicates a range including numerical values described before and after "to" as a lower limit and an upper limit.

In a numerical range described in a stepwise manner in the present disclosure, an upper limit or a lower limit described in one numerical range may be replaced with an upper limit or a lower limit in another numerical range described in a stepwise manner. Further, in a numerical range described in the present disclosure, an upper limit or a lower limit described in the numerical range may be replaced with a value described in an example.

Further, in a case where substitution or unsubstitution is not noted in regard to the notation of a "group" (atomic group) in the present specification, the "group" includes not only a group that does not have a substituent but also a group having a substituent. For example, the concept of an "alkyl group" includes not only an alkyl group that does not have a substituent (unsubstituted alkyl group) but also an alkyl group having a substituent (substituted alkyl group).

In the present specification, the concept of "(meth)acryl" includes both acryl and methacryl, and the concept of "(meth)acryloyl" includes both acryloyl and methacryloyl.

Further, the term "step" in the present specification indicates not only an independent step but also a step which cannot be clearly distinguished from other steps as long as the intended purpose of the step is achieved.

Further, in the present disclosure, "% by mass" has the same definition as that for "% by weight", and "part by mass" has the same definition as that for "part by weight".

Furthermore, in the present disclosure, a combination of two or more preferred embodiments is a more preferred embodiment.

Further, the weight-average molecular weight (Mw) and the number-average molecular weight (Mn) in the present disclosure are molecular weights converted using polystyrene as a standard substance by performing detection with a gel permeation chromatography (GPC) analysis apparatus using TSKgel SuperHM-H (trade name, manufactured by Tosoh Corporation) column, a solvent of pentafluorophenol (PFP) and chloroform at a mass ratio of 1:2, and a differential refractometer, unless otherwise specified.

(Film)

A first embodiment of the film according to the present disclosure has a dielectric loss tangent of 0.005 or less and has an elastic modulus of at least one surface at 160° C., which is smaller than an elastic modulus of an inside at 160° C.

In addition, a second embodiment of the film according to the present disclosure has a dielectric loss tangent of 0.005 or less and has an elastic modulus of at least one surface at 300° C., which is smaller than an elastic modulus of an inside at 300° C.

In addition, a third embodiment of the film according to the present disclosure has a dielectric loss tangent of 0.010 or less and has an elastic modulus of at least one surface at 160° C., which is smaller than an elastic modulus of an inside at 160° C.

In addition, a fourth embodiment of the film according to the present disclosure has a dielectric loss tangent of 0.010 or less and has an elastic modulus of at least one surface at 300° C., which is smaller than an elastic modulus of an inside at 300° C.

Here, the surface of the polymer film refers to an outer surface (a surface in contact with air or the substrate) of the polymer film, and in the present disclosure, in a case where a thickness of the film is 30 μm or less, the "surface" of the film refers to a region from the outermost surface of the film to a position corresponding to 10% thickness with respect to the thickness of the film. In a case where the thickness of the film is more than 30 μm, the "surface" refers to a region from the outermost surface of the film to a position separated by 3 μm in the thickness direction.

In the present disclosure, in a case where the thickness of the film is 30 μm or less, the "inside" of the film refers to a region from the center of the film in the thickness direction to a position corresponding to ±5% thickness with respect to the thickness of the film. In a case where the thickness of the film is more than 30 μm, the "inside" refers to a region from the center of the film in the thickness direction to a position separated by ±1.5 μm in the thickness direction.

In the present specification, the expression "film according to the embodiment of the present disclosure" or "film" denotes both of the above-described first embodiment and the above-described second embodiment, unless otherwise specified.

Many of the films in the related art have a large linear expansion coefficient, such as the film disclosed in JP2020-26474A. In the film disclosed in JP2020-26474A, it has been found that a distortion occurs in a metal wire in a case where the film is adhered to the metal wire.

As a result of intensive studies, the present inventor has found that, with the above-described configuration, it is possible to provide a film capable of suppressing the distortion of the metal wire in a case where the film is adhered to the metal wire.

The detailed mechanism for obtaining the above-described effects is not clear, but assumed as follows.

In the film according to the embodiment of the present disclosure, since the elastic modulus of at least one surface at 160° C. is smaller than the elastic modulus of the inside at 160° C., the film can be deformed to follow a shape of the metal wire in a case where the film is adhered to the metal wire. In addition, in the film according to the embodiment of the present disclosure, since the elastic modulus of at least one surface at 300° C. is smaller than the elastic modulus of the inside at 300° C., the film can be deformed to follow a shape of the metal wire in a case where the film is adhered to the metal wire. As a result, it is considered that the distortion of the metal wire is suppressed.

From the viewpoint of suppressing the distortion of the metal wire in a case where the film is adhered to the metal wire, the dielectric loss tangent of the film according to the embodiment of the present disclosure is 0.010 or less, preferably 0.005 or less and more preferably more than 0 and 0.003 or less.

The dielectric loss tangent in the present disclosure is measured by the following method.

The dielectric loss tangent is measured by a resonance perturbation method at a frequency of 10 GHz. A 10 GHz cavity resonator (CP531 of Kanto Electronics Application & Development Inc.) is connected to a network analyzer ("E8363B" manufactured by Agilent Technology), a sample (width: 2.0 mm×length: 80 mm) is inserted into the cavity resonator, and the dielectric loss tangent is measured based on a change in resonance frequency for 96 hours before and after the insertion in an environment of a temperature of 25° C. and a humidity of 60% RH.

In a case where each layer is measured, an unnecessary layer may be scraped off with a razor or the like to produce an evaluation sample of only the target layer. In addition, in a case where it is difficult to take out the single film because the thickness of the layer is thin, a layer to be measured may be scraped off with a razor or the like, and the obtained powdery sample may be used.

The first embodiment of the film according to the present disclosure has an elastic modulus of at least one surface at 160° C., which is smaller than an elastic modulus of an inside at 160° C.

In addition, the second embodiment of the film according to the present disclosure has an elastic modulus of at least one surface at 300° C., which is smaller than an elastic modulus of an inside at 300° C.

In the film according to the embodiment of the present disclosure, it is preferable that the elastic modulus of at least one surface at 160° C. is smaller than the elastic modulus of the inside at 160° C., and the elastic modulus of at least one surface at 300° C. is smaller than the elastic modulus of the inside at 300° C.

A difference between the elastic modulus of at least one surface at 160° C. and the elastic modulus of the inside at 160° C. is preferably 0.1 GPa or more, more preferably 0.8 GPa or more, and still more preferably 1.5 GPa or more. The upper limit value of the above-described difference is not particularly limited, and is, for example, 3.0 GPa.

A difference between the elastic modulus of at least one surface at 300° C. and the elastic modulus of the inside at 300° C. is preferably 0.1 GPa or more, more preferably 0.5 GPa or more, and still more preferably 0.8 GPa or more. The upper limit value of the above-described difference is not particularly limited, and is, for example, 2.0 GPa.

In the film according to the embodiment of the present disclosure, a loss tangent of at least one surface at 160° C. is preferably 0.03 or more, more preferably 0.1 or more, and still more preferably 0.2 or more. The upper limit value of the loss tangent of the surface at 160° C. is not particularly limited, and is, for example, 1.0.

In addition, in the film according to the embodiment of the present disclosure, a loss tangent of at least one surface at 300° C. is preferably 0.1 or more, more preferably 0.3 or more, and still more preferably 1.0 or more. The upper limit value of the loss tangent of the surface at 300° C. is not particularly limited, and is, for example, 10.

In the film according to the embodiment of the present disclosure, an elastic modulus of the inside at 160° C. is preferably 0.5 GPa or more, more preferably 1.0 GPa or more, still more preferably 1.5 GPa or more, and particularly preferably 2.0 GPa or more. The upper limit value of the elastic modulus of the inside at 160° C. is not particularly limited, and is, for example, 3.0 GPa.

In addition, in the film according to the embodiment of the present disclosure, an elastic modulus of the inside at 300° C. is preferably 0.1 GPa or more, more preferably 0.5 GPa or more, still more preferably 0.7 GPa or more, and particularly preferably 1.0 GPa or more. The upper limit value of the elastic modulus of the inside at 300° C. is not particularly limited, and is, for example, 2.0 GPa.

In the film according to the embodiment of the present disclosure, an elastic modulus of at least one surface at 160° C. is preferably 3.0 GPa or less, more preferably 1.0 GPa or less, and still more preferably 0.7 GPa or less. The lower limit value of the elastic modulus of the surface at 160° C. is not particularly limited, and is, for example, 0.01 GPa.

In addition, in the film according to the embodiment of the present disclosure, an elastic modulus of at least one surface at 300° C. is preferably 2.0 GPa or less, more preferably 0.7 GPa or less, and still more preferably 0.3 GPa or less. The lower limit value of the elastic modulus of the surface at 300° C. is not particularly limited, and is, for example, 0.001 GPa.

In a case where the elastic modulus of the film according to the embodiment of the present disclosure at each temperature is within the above-described range, the film can be deformed to follow a shape of the metal wire in a case where the film is adhered to the metal wire, and as a result, it is considered that the distortion of the metal wire is suppressed. Therefore, each temperature of the elastic modulus described above can be used as an indicator of a processing temperature in a manufacturing process in a case where the film according to the embodiment of the present disclosure and a metal (for example, a metal foil and a metal wire) are adhered to each other.

From the viewpoint of suppressing the distortion of the metal wire, it is preferable that the elastic modulus of one surface on a side in contact with the metal layer is within the above-described range.

The elastic modulus and loss tangent in the present disclosure are measured by the following method.

A sample for evaluating a cross section is produced by embedding the film in an ultraviolet curable (UV) resin and cutting the film with a microtome. Subsequently, the storage elastic modulus and the loss tangent (loss elastic modulus/storage elastic modulus) of the surface and the inside are calculated by observing the sample in a VE-AFM mode using a scanning probe microscope (SPA400, manufactured by Hitachi High-Tech Science Corporation).

The elastic modulus in the present disclosure means "storage elastic modulus".

The elastic modulus at 160° C. means an elastic modulus measured in a state in which the temperature of the sample is adjusted to 160° C.

The elastic modulus at 300° C. means an elastic modulus measured in a state in which the temperature of the sample is adjusted to 300° C.

A linear expansion coefficient of the film according to the embodiment of the present disclosure is preferably −20 ppm/K to 50 ppm/K, and from the viewpoint of suppressing the distortion of the metal wire in a case where the film is adhered to the metal wire, more preferably −10 ppm/K to 40 ppm/K, still more preferably 0 ppm/K to 35 ppm/K, particularly preferably 10 ppm/K to 30 ppm/K, and particularly preferably 15 ppm/K to 25 ppm/K.

The linear expansion coefficient in the present disclosure is measured by the following method.

Using a thermomechanical analyzer (TMA), a tensile load of 1 g is applied to both ends of the film which has a width of 5 mm and a length of 20 mm, and the film is heated from 25° C. to 200° C. at a rate of 5° C./min. Thereafter, the measurement sample was cooled to 30° C. at a rate of 20° C./min and then heated again at a rate of 5° C./min, and the linear expansion coefficient is calculated from the inclination of TMA curve between 30° C. to 150° C.

In addition, in a case where it is difficult to measure the linear expansion coefficient by the above-described method, the measurement is carried out by the following method.

The film is cut with a microtome to produce a section sample, and the section sample is set in an optical microscope equipped with a heating stage system (HS82, manufactured by METTLER TOLEDO). Subsequently, the section sample is heated from 25° C. to 200° C. at a rate of 5° C./min. Thereafter, the section sample is cooled to 30° C. at a rate of 20° C./min and then heated again at a rate of 5° C./min, and a thickness of the film at 30° C. (ts30) and a thickness of the film at 150° C. (ts150) are evaluated. Thereafter, a value obtained by dividing the dimensional change by the temperature change ((ts150−ts30)/(150−30)) is calculated to obtain the linear expansion coefficient of the film.

The film according to the embodiment of the present disclosure preferably contains a polymer having a dielectric loss tangent of 0.01 or less. The dielectric loss tangent of the polymer is, for example, 0.010 or less, preferably 0.008 or less, more preferably 0.0075 or less, still more preferably 0.006 or less, and particularly preferably 0.005 or less. In addition, from the viewpoint of dielectric loss tangent of the polymer film and adhesiveness with a metal (for example, a metal layer), the dielectric loss tangent of the polymer is preferably 0.004 or less, more preferably 0.0035 or less, and particularly preferably 0.003 or less. The lower limit value of the dielectric loss tangent of the polymer is not particularly limited, but is, for example, more than 0.

In the present disclosure, the measurement of the dielectric loss tangent of the polymer is carried out according to the above-described method of measuring a dielectric loss tangent by identifying or isolating a chemical structure of the polymer and using a powdered sample of the polymer to be measured.

Examples of the polymer having a dielectric loss tangent of 0.005 or less include thermoplastic resins such as a liquid crystal polymer, a fluorine-based polymer, a polymerized substance of a compound which has a cyclic aliphatic hydrocarbon group and a group having an ethylenically unsaturated bond, polyether ether ketone, polyolefin, polyamide, polyester, polyphenylene sulfide, polyether ketone, polycarbonate, polyethersulfone, polyphenylene ether and a modified product thereof, and polyetherimide; elastomers such as a copolymer of glycidyl methacrylate and polyethylene; and thermosetting resins such as a phenol resin, an epoxy resin, a polyimide resin, and a cyanate resin.

Among these, as the polymer, from the viewpoint of further reducing the dielectric loss tangent of the film, at least one polymer selected from the group consisting of a liquid crystal polymer, a fluorine-based polymer, a polymerized substance of a compound which has a cyclic aliphatic hydrocarbon group and a group having an ethylenically unsaturated bond, polyphenylene ether, and aromatic polyether ketone is preferable, and at least one polymer selected from the group consisting of a liquid crystal polymer and a fluorine-based polymer is more preferable. From the viewpoint of film-forming properties and mechanical strength, the polymer is preferably a liquid crystal polymer, and from the viewpoint of dielectric loss tangent, the polymer is preferably a fluorine-based polymer.

—Liquid Crystal Polymer—

In the present disclosure, the type of the liquid crystal polymer is not particularly limited, and a known liquid crystal polymer can be used.

In addition, the liquid crystal polymer may be a thermotropic liquid crystal polymer which exhibits liquid crystallinity in a molten state, or may be a lyotropic liquid crystal polymer which exhibits liquid crystallinity in a solution state. Further, in a case where the liquid crystal polymer is a thermotropic liquid crystal polymer, the liquid crystal polymer is preferably a liquid crystal polymer which is molten at a temperature of 450° C. or lower.

Examples of the liquid crystal polymer include a liquid crystal polyester, a liquid crystal polyester amide in which an amide bond is introduced into the liquid crystal polyester, a liquid crystal polyester ether in which an ether bond is introduced into the liquid crystal polyester, and a liquid crystal polyester carbonate in which a carbonate bond is introduced into the liquid crystal polyester.

In addition, as the liquid crystal polymer, from the viewpoint of liquid crystallinity, a polymer having an aromatic ring is preferable, and an aromatic polyester or an aromatic polyester amide is more preferable.

Further, the liquid crystal polymer may be a polymer in which an imide bond, a carbodiimide bond, a bond derived from an isocyanate, such as an isocyanurate bond, or the like is further introduced into the aromatic polyester or the aromatic polyester amide.

Further, it is preferable that the liquid crystal polymer is a wholly aromatic liquid crystal polymer formed of only an aromatic compound as a raw material monomer.

Examples of the liquid crystal polymer include the following liquid crystal polymers.

1) a liquid crystal polymer obtained by polycondensing (i) an aromatic hydroxycarboxylic acid, (ii) an aromatic dicarboxylic acid, and (iii) at least one compound selected from the group consisting of an aromatic diol, an aromatic hydroxyamine, and an aromatic diamine;
2) a liquid crystal polymer obtained by polycondensing a plurality of types of aromatic hydroxycarboxylic acids;
3) a liquid crystal polymer obtained by polycondensing (i) an aromatic dicarboxylic acid and (ii) at least one compound selected from the group consisting of an aromatic diol, an aromatic hydroxyamine, and an aromatic diamine;
4) a liquid crystal polymer obtained by polycondensing (i) polyester such as polyethylene terephthalate and (ii) an aromatic hydroxycarboxylic acid.

Here, the aromatic hydroxycarboxylic acid, the aromatic dicarboxylic acid, the aromatic diol, the aromatic hydroxyamine, and the aromatic diamine may be each independently replaced with a polycondensable derivative.

For example, the aromatic hydroxycarboxylic acid and the aromatic dicarboxylic acid can be replaced with aromatic hydroxycarboxylic acid ester and aromatic dicarboxylic acid ester, by converting a carboxy group into an alkoxycarbonyl group or an aryloxycarbonyl group.

The aromatic hydroxycarboxylic acid and the aromatic dicarboxylic acid can be replaced with aromatic hydroxycarboxylic acid halide and aromatic dicarboxylic acid halide, by converting a carboxy group into a haloformyl group.

The aromatic hydroxycarboxylic acid and the aromatic dicarboxylic acid can be replaced with aromatic hydroxycarboxylic acid anhydride and aromatic dicarboxylic acid anhydride, by converting a carboxy group into an acyloxycarbonyl group.

Examples of a polymerizable derivative of a compound having a hydroxy group, such as an aromatic hydroxycarboxylic acid, an aromatic diol, and an aromatic hydroxyamine, include a derivative (acylated product) obtained by acylating a hydroxy group and converting the acylated group into an acyloxy group.

For example, the aromatic hydroxycarboxylic acid, the aromatic diol, and the aromatic hydroxyamine can be each replaced with an acylated product by acylating a hydroxy group and converting the acylated group into an acyloxy group.

Examples of a polymerizable derivative of a compound having an amino group, such as an aromatic hydroxyamine or an aromatic diamine, include a derivative (acylated product) obtained by acylating an amino group and converting the acylated group to an acylamino group.

For example, the aromatic hydroxyamine and the aromatic diamine can be each replaced with an acylated product by acylating an amino group and converting the acylated group into an acylamino group.

From the viewpoint of liquid crystallinity, the liquid crystal polymer preferably has a constitutional unit represented by any of Formulae (1) to (3), more preferably has a constitutional unit represented by Formula (1), and particularly preferably has a constitutional unit represented by Formula (1), a constitutional unit represented by Formula (2), and a constitutional unit represented by Formula (3). Hereinafter, the constitutional unit represented by Formula (1) and the like are also referred to as "unit (1)" and the like.

—O—Ar$^1$—CO—        Formula (1)

—CO—Ar$^2$—CO—        Formula (2)

—X—Ar$^3$—Y—        Formula (3)

In Formulae (1) to (3), Ar$^1$ represents a phenylene group, a naphthylene group, or a biphenylylene group, Ar$^2$ and Ar$^3$ each independently represent a phenylene group, a naphthylene group, a biphenylylene group, or a group represented by Formula (4), X and Y each independently represent an oxygen atom or an imino group, and hydrogen atoms in Ar$^1$ to Ar$^3$ may be each independently substituted with a halogen atom, an alkyl group, or an aryl group.

—Ar$^4$—Z—Ar$^5$—        Formula (4)

In Formula (4), Ar$^4$ and Ar$^5$ each independently represent a phenylene group or a naphthylene group, and Z represents an oxygen atom, a sulfur atom, a carbonyl group, a sulfonyl group, or an alkylene group.

Examples of the halogen atom include a fluorine atom, a chlorine atom, a bromine atom, and an iodine atom.

Examples of the alkyl group include a methyl group, an ethyl group, an n-propyl group, an isopropyl group, an n-butyl group, an isobutyl group, an s-butyl group, a t-butyl group, an n-hexyl group, a 2-ethylhexyl group, an n-octyl group, and an n-decyl group. The number of carbon atoms in the alkyl group is preferably 1 to 10.

Examples of the aryl group include a phenyl group, an o-tolyl group, an m-tolyl group, a p-tolyl group, a 1-naphthyl group, and a 2-naphthyl group. The number of carbon atoms in the aryl group is preferably 6 to 20.

In a case where the hydrogen atom in Ar$^1$ to Ar$^3$ is substituted with a halogen atom, an alkyl group, or an aryl group, the number of each of substituents in Ar$^1$, Ar$^2$, and Ar$^3$ independently is preferably 2 or less and more preferably 1.

Examples of the alkylene group include a methylene group, a 1,1-ethanediyl group, a 1-methyl-1,1-ethanediyl group, a 1,1-butanediyl group, and a 2-ethyl-1,1-hexanediyl group. The number of carbon atoms in the alkylene group is preferably 1 to 10.

The unit (1) is a constitutional unit derived from an aromatic hydroxycarboxylic acid.

Preferred examples of the unit (1) include an aspect in which Ar$^1$ represents a p-phenylene group (constitutional unit derived from p-hydroxybenzoic acid), an aspect in which Ar$^1$ represents a 2,6-naphthylene group (constitutional unit derived from 6-hydroxy-2-naphthoic acid), and an aspect in which Ar$^1$ represents a 4,4'-biphenylylene group (constitutional unit derived from 4'-hydroxy-4-biphenylcarboxylic acid).

The unit (2) is a constitutional unit derived from an aromatic dicarboxylic acid.

Preferred examples of the unit (2) include an aspect in which Ar$^2$ represents a p-phenylene group (constitutional unit derived from terephthalic acid), an aspect in which Ar$^2$ represents an m-phenylene group (constitutional unit derived from isophthalic acid), an aspect in which Ar$^2$ represents a 2,6-naphthylene group (constitutional unit derived from 2,6-naphthalenedicarboxylic acid), and an aspect in which Ar$^2$ represents a diphenylether-4,4'-diyl group (constitutional unit derived from diphenylether-4,4'-dicarboxylic acid).

The unit (3) is a constitutional unit derived from an aromatic diol, an aromatic hydroxylamine, or an aromatic diamine.

Preferred examples of the unit (3) include an aspect in which Ar$^3$ represents a p-phenylene group (constitutional unit derived from hydroquinone, p-aminophenol, or p-phenylenediamine), an aspect in which Ar$^3$ represents an m-phenylene group (constitutional unit derived from isophthalic acid), and an aspect in which Ar$^3$ represents a 4,4'-biphenylylene group (constitutional unit derived from 4,4'-dihydroxybiphenyl, 4-amino-4'-hydroxybiphenyl, or 4,4'-diaminobiphenyl).

The content of the unit (1) is preferably 30% by mole or more, more preferably 30% by mole to 80% by mole, still more preferably 30% by mole to 60% by mole, and particularly preferably 30% by mole to 40% by mole with respect to the total amount of all constitutional units.

The content of the unit (2) is preferably 35% by mole or less, more preferably 10% by mole to 35% by mole, still more preferably 20% by mole to 35% by mole, and particularly preferably 30% by mole to 35% by mole with respect to the total amount of all constitutional units.

The content of the unit (3) is preferably 35% by mole or less, more preferably 10% by mole to 35% by mole, still more preferably 20% by mole to 35% by mole, and particularly preferably 30% by mole to 35% by mole with respect to the total amount of all constitutional units.

The heat resistance, the strength, and the rigidity are likely to be improved as the content of the unit (1) increases, but the solubility in a solvent is likely to be decreased in a case where the content thereof is too large.

The total amount of all constitutional units is a value obtained by totaling a substance amount (mol) of each constitutional unit. The substance amount of each constitutional unit is calculated by dividing a mass of each constitutional unit constituting the liquid crystal polymer by a formula weight of each constitutional unit.

In a case where a ratio of the content of the unit (2) to the content of the unit (3) is expressed as [content of unit (2)]/[content of unit (3)] (mol/mol), the ratio is preferably 0.9/1 to 1/0.9, more preferably 0.95/1 to 1/0.95, and still more preferably 0.98/1 to 1/0.98.

The liquid crystal polymer may have two or more kinds of each of the units (1) to (3) independently. In addition, the liquid crystal polymer may have a constitutional unit other than the units (1) to (3). A content of other constitutional units is preferably 10% by mole or less and more preferably 5% by mole or less with respect to the total amount of all constitutional units.

Since the solubility in a solvent is excellent, the liquid crystal polymer preferably has a unit (3) in which at least one of X or Y is an imino group, that is, preferably has at least one of a constitutional unit derived from an aromatic hydroxylamine or a constitutional unit derived from an aromatic diamine, and it is more preferable to have only a unit (3) in which at least one of X or Y is an imino group.

It is preferable that the liquid crystal polymer is produced by melt-polymerizing raw material monomers corresponding to the constitutional units constituting the liquid crystal polymer. The melt polymerization may be carried out in the presence of a catalyst. Examples of the catalyst include metal compounds such as magnesium acetate, stannous acetate, tetrabutyl titanate, lead acetate, sodium acetate, potassium acetate, and antimony trioxide, and nitrogen-containing heterocyclic compounds such as 4-(dimethylamino)pyridine and 1-methylimidazole. The catalyst is preferably a nitrogen-containing heterocyclic compound. The melt polymerization may be further carried out by solid phase polymerization as necessary.

A flow start temperature of the liquid crystal polymer is preferably 180° C. or higher, more preferably 200° C. or higher, and still more preferably 250° C. or higher. In addition, the flow start temperature thereof is preferably 350° C. or lower, more preferably 330° C. or lower, and still more preferably 310° C. or lower. In a case where the flow start temperature of the liquid crystal polymer is within the above-described range, the solubility, the heat resistance, the strength, and the rigidity are excellent, and the viscosity of the solution is appropriate.

The flow start temperature, also referred to as a flow temperature, is a temperature at which a viscosity of 4,800 Pa s (48,000 poises) is exhibited in a case where the liquid crystal polymer is melted and extruded from a nozzle having an inner diameter of 1 mm and a length of 10 mm while the temperature is raised at a rate of 4° C./min under a load of 9.8 MPa (100 kg/cm$^2$) using a capillary rheometer and is a guideline for the molecular weight of the liquid crystal polymer (see p. 95 of "Liquid Crystal Polymers—Synthesis/Molding/Applications—", written by Naoyuki Koide, CMC Corporation, Jun. 5, 1987).

In addition, a weight-average molecular weight of the liquid crystal polymer is preferably 1,000,000 or less, more preferably 3,000 to 300,000, still more preferably 5,000 to 100,000, and particularly preferably 5,000 to 30,000. In a case where the weight-average molecular weight of the liquid crystal polymer is within the above-described range, a film after heat treatment is excellent in thermal conductivity, heat resistance, strength, and rigidity in the thickness direction.

—Fluorine-Based Polymer—

In the present disclosure, the type of the fluorine-based polymer is not particularly limited, and a known fluorine-based polymer can be used.

In addition, examples of the fluorine-based polymer include a homopolymer and a copolymer containing a constitutional unit derived from a fluorinated α-olefin monomer, that is, an α-olefin monomer containing at least one fluorine atom. In addition, examples of the fluorine-based polymer include a copolymer containing a constitutional unit derived from a fluorinated α-olefin monomer, and a constitutional unit derived from a non-fluorinated ethylenically unsaturated monomer reactive to the fluorinated α-olefin monomer.

Examples of the fluorinated α-olefin monomer include $CF_2{=}CF_2$, $CHF{=}CF_2$, $CH_2{=}CF_2$, $CHCl{=}CHF$, $CClF{=}CF_2$, $CCl_2{=}CF_2$, $CClF{=}CClF$, $CHF{=}CCl_2$, $CH_2{=}CClF$, $CCl_2{=}CClF$, $CF_3CF{=}CF_2$, $CF_3CF{=}CHF$, $CF_3CH{=}CF_2$, $CF_3CH{=}CH_2$, $CHF_2CH{=}CHF$, $CF_3CF{=}CF_2$, and perfluoro(alkyl having 2 to 8 carbon atoms) vinyl ether (for example, perfluoromethyl vinyl ether, perfluoropropyl vinyl ether, and perfluorooctyl vinyl ether). Among these, as the fluorinated α-olefin monomer, at least one monomer selected from the group consisting of tetrafluoroethylene ($CF_2{=}CF_2$), chlorotrifluoroethylene ($CClF{=}CF_2$), (perfluorobutyl)ethylene, vinylidene fluoride ($CH_2{=}CF_2$), and hexafluoropropylene ($CF_2{=}CFCF_3$) is preferable.

Examples of the non-fluorinated ethylenically unsaturated monomer include ethylene, propylene, butene, and an ethylenically unsaturated aromatic monomer (for example, styrene and α-methylstyrene).

The fluorinated α-olefin monomer may be used alone or in combination of two or more thereof.

In addition, the non-fluorinated ethylenically unsaturated monomer may be used alone or in combination of two or more thereof.

Examples of the fluorine-based polymer include polychlorotrifluoroethylene (PCTFE), poly(chlorotrifluoroethylene-propylene), poly(ethylene-tetrafluoroethylene) (ETFE), poly(ethylene-chlorotrifluoroethylene) (ECTFE), poly(hexafluoropropylene), poly(tetrafluoroethylene) (PTFE), poly(tetrafluoroethylene-ethylene-propylene), poly(tetrafluoroethylene-hexafluoropropylene) (FEP), poly(tetrafluoroethylene-propylene) (FEPM), poly(tetrafluoroethylene-perfluoropropylene vinyl ether), poly(tetrafluoroethylene-perfluoroalkyl vinyl ether) (PFA) (for example, poly(tetrafluoroethylene-perfluoropropyl vinyl ether)), polyvinyl fluoride (PVF), polyvinylidene fluoride (PVDF), poly(vinylidene fluoride-chlorotrifluoroethylene), perfluoropolyether, perfluorosulfonic acid, and perfluoropolyoxetane.

The fluorine-based polymer may have a constitutional unit derived from fluorinated ethylene or fluorinated propylene.

The fluorine-based polymer may be used alone or in combination of two or more thereof.

The fluorine-based polymer is preferably FEP, PFA, ETFE, or PTFE.

The FEP is available from Du Pont as the trade name of TEFLON (registered trademark) FEP or from DAIKIN INDUSTRIES, LTD. as the trade name of NEOFLON FEP. The PFA is available from DAIKIN INDUSTRIES, LTD. as the trade name of NEOFLON PFA, from Du Pont as the trade name of TEFLON (registered trademark) PFA, or from Solvay Solexis as the trade name of HYFLON PFA.

The fluorine-based polymer more preferably includes PTFE. The PTFE may be a PTFE homopolymer, a partially modified PTFE homopolymer, or a combination including one or both of these. The partially modified PTFE homopolymer preferably contains a constitutional unit derived from a comonomer other than tetrafluoroethylene in an amount of less than 1% by mass based on the total mass of the polymer.

The fluorine-based polymer may be a crosslinkable fluoropolymer having a crosslinkable group. The crosslinkable fluoropolymer can be crosslinked by a known crosslinking method in the related art. One of the representative crosslinkable fluoropolymers is a fluoropolymer having (meth) acryloyloxy. For example, the crosslinkable fluoropolymer can be represented by Formula:

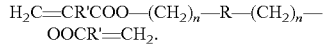

In the formula, R is an oligomer chain having a constitutional unit derived from the fluorinated α-olefin monomer, R' is H or —CH$_3$, and n is 1 to 4. R may be a fluorine-based oligomer chain having a constitutional unit derived from tetrafluoroethylene.

In order to initiate a radical crosslinking reaction through the (meth)acryloyloxy group in the fluorine-based polymer, by exposing the fluoropolymer having a (meth)acryloyloxy group to a free radical source, a crosslinked fluoropolymer network can be formed. The free radical source is not particularly limited, and suitable examples thereof include a photoradical polymerization initiator and an organic peroxide. Appropriate photoradical polymerization initiators and organic peroxides are well known in the art. The crosslinkable fluoropolymer is commercially available, and examples thereof include Viton B manufactured by Du Pont.

—Polymerized Substance of Compound which has Cyclic Aliphatic Hydrocarbon Group and Group Having Ethylenically Unsaturated Bond—

Examples of the polymerized substance of a compound which has a cyclic aliphatic hydrocarbon group and a group having an ethylenically unsaturated bond include thermoplastic resins having a constitutional unit derived from a cyclic olefin monomer such as norbornene and a polycyclic norbornene-based monomer.

The polymerized substance of a compound which has a cyclic aliphatic hydrocarbon group and a group having an ethylenically unsaturated bond may be a ring-opened polymer of the above-described cyclic olefin, a hydrogenated product of a ring-opened copolymer using two or more cyclic olefins, or an addition polymer of a cyclic olefin and a linear olefin or aromatic compound having an ethylenically unsaturated bond such as a vinyl group. In addition, a polar group may be introduced into the polymerized substance of a compound which has a cyclic aliphatic hydrocarbon group and a group having an ethylenically unsaturated bond.

The polymerized substance of a compound which has a cyclic aliphatic hydrocarbon group and a group having an ethylenically unsaturated bond may be used alone or in combination of two or more thereof.

A ring structure of the cyclic aliphatic hydrocarbon group may be a single ring, a fused ring in which two or more rings are fused, or a crosslinked ring.

Examples of the ring structure of the cyclic aliphatic hydrocarbon group include a cyclopentane ring, a cyclohexane ring, a cyclooctane ring, an isophorone ring, a norbornane ring, and a dicyclopentane ring.

The compound which has a cyclic aliphatic hydrocarbon group and a group having an ethylenically unsaturated bond is not particularly limited, and examples thereof include a (meth)acrylate compound having a cyclic aliphatic hydrocarbon group, a (meth)acrylamide compound having a cyclic aliphatic hydrocarbon group, and a vinyl compound having a cyclic aliphatic hydrocarbon group. Among these, preferred examples thereof include a (meth)acrylate compound having a cyclic aliphatic hydrocarbon group. In addition, the compound which has a cyclic aliphatic hydrocarbon group and a group having an ethylenically unsaturated bond may be a monofunctional ethylenically unsaturated compound or a polyfunctional ethylenically unsaturated compound.

The number of cyclic aliphatic hydrocarbon groups in the compound which has a cyclic aliphatic hydrocarbon group and a group having an ethylenically unsaturated bond may be 1 or more, and may be 2 or more.

It is sufficient that the polymerized substance of a compound which has a cyclic aliphatic hydrocarbon group and a group having an ethylenically unsaturated bond is a polymer obtained by polymerizing at least one compound which has a cyclic aliphatic hydrocarbon group and a group having an ethylenically unsaturated bond, and it may be a polymerized substance of two or more kinds of the compound which has a cyclic aliphatic hydrocarbon group and a group having an ethylenically unsaturated bond or a copolymer with other ethylenically unsaturated compounds having no cyclic aliphatic hydrocarbon group.

In addition, the polymerized substance of a compound which has a cyclic aliphatic hydrocarbon group and a group having an ethylenically unsaturated bond is preferably a cycloolefin polymer.

—Polyphenylene Ether—

In a case where heat curing is performed after film formation, from the viewpoint of heat resistance and film-forming property, a weight-average molecular weight (Mw) of the polyphenylene ether is preferably 500 to 5,000 and preferably 500 to 3,000. In addition, in a case where the heat curing is not performed, the weight-average molecular weight (Mw) of the polyphenylene ether is not particularly limited, but is preferably 3,000 to 100,000 and preferably 5,000 to 50,000.

In the polyphenylene ether, from the viewpoint of dielectric loss tangent and heat resistance, the average number of molecular terminal phenolic hydroxyl groups per molecule (the number of terminal hydroxyl groups) is preferably 1 to 5 and more preferably 1.5 to 3.

The number of terminal hydroxyl groups in the polyphenylene ether can be found, for example, from a standard value of a product of the polyphenylene ether. In addition, the number of terminal hydroxyl groups is expressed as, for example, an average value of the number of phenolic hydroxyl groups per molecule of all polyphenylene ethers present in 1 mol of the polyphenylene ether.

The polyphenylene ether may be used alone or in combination of two or more thereof.

Examples of the polyphenylene ether include a polyphenylene ether including 2,6-dimethylphenol and at least one of bifunctional phenol or trifunctional phenol, and poly(2, 6-dimethyl-1,4-phenylene oxide). More specifically, the polyphenylene ether is preferably a compound having a structure represented by Formula (PPE).

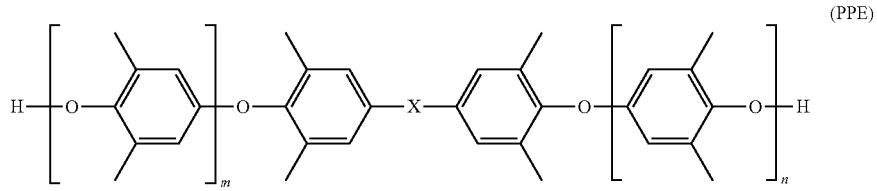

In Formula (PPE), X represents an alkylene group having 1 to 3 carbon atoms or a single bond, m represents an integer of 0 to 20, n represents an integer of 0 to 20, and the sum of m and n represents an integer of 1 to 30.

Examples of the alkylene group in X described above include a dimethylmethylene group.

—Aromatic Polyether Ketone—

The aromatic polyether ketone is not particularly limited, and a known aromatic polyether ketone can be used.

The aromatic polyether ketone is preferably a polyether ether ketone.

The polyether ether ketone is one type of the aromatic polyether ketone, and is a polymer in which bonds are arranged in the order of an ether bond, an ether bond, and a carbonyl bond. It is preferable that the bonds are linked to each other by a divalent aromatic group.

The aromatic polyether ketone may be used alone or in combination of two or more thereof.

Examples of the aromatic polyether ketone include polyether ether ketone (PEEK) having a chemical structure represented by Formula (P1), polyether ketone (PEK) having a chemical structure represented by Formula (P2), polyether ketone ketone (PEKK) having a chemical structure represented by Formula (P3), polyether ether ketone ketone (PEEKK) having a chemical structure represented by Formula (P4), and polyether ketone ether ketone ketone (PEKEKK) having a chemical structure represented by Formula (P5).

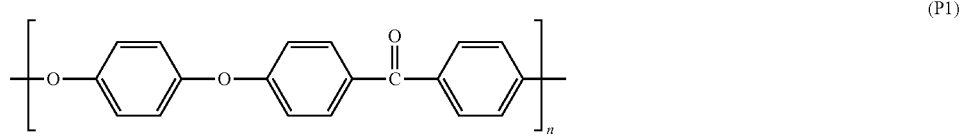

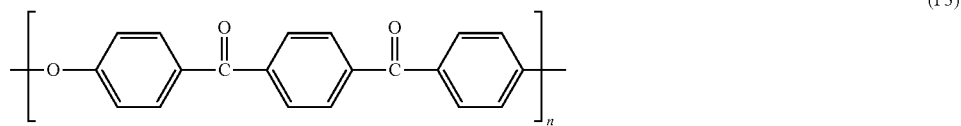

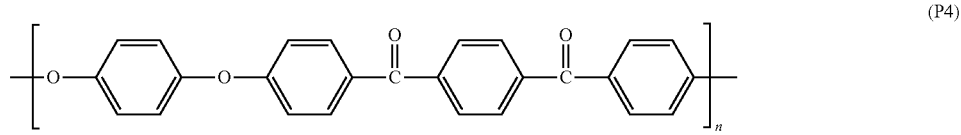

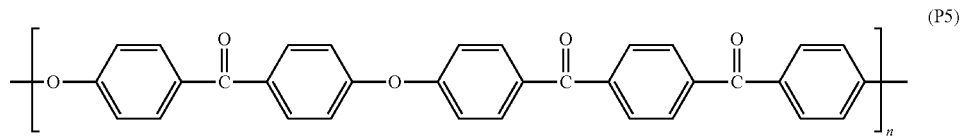

From the viewpoint of mechanical properties, each n of Formulae (P1) to (P5) is preferably 10 or more and more preferably 20 or more. On the other hand, from the viewpoint that the aromatic polyether ketone can be easily produced, n is preferably 5,000 or less and more preferably 1,000 or less. That is, n is preferably 10 to 5,000 and more preferably 20 to 1,000.

The polymer contained in the film according to the embodiment of the present disclosure is preferably a polymer soluble in a specific organic solvent (hereinafter, also referred to as "soluble polymer").

Specifically, the soluble polymer in the present disclosure is a polymer in which 0.1 g or more thereof is dissolved at 25° C. in 100 g of at least one solvent selected from the group consisting of N-methylpyrrolidone, N-ethylpyrrolidone, dichloromethane, dichloroethane, chloroform, N,N-dimethylacetamide, γ-butyrolactone, dimethylformamide, ethylene glycol monobutyl ether, and ethylene glycol monoethyl ether.

The film according to the embodiment of the present disclosure may contain only one or two or more kinds of the polymers.

From the viewpoint of dielectric loss tangent of the film and adhesiveness with a metal, a content of the polymer is preferably 20% by mass to 99% by mass, more preferably 30% by mass to 98% by mass, still more preferably 40% by mass to 97% by mass, and particularly preferably 50% by mass to 95% by mass with respect to the total mass of the film.

The film according to the embodiment of the present disclosure preferably contains a filler.

—Filler—

The filler may be particulate or fibrous, and may be an inorganic filler or an organic filler.

In the film according to the embodiment of the present disclosure, from the viewpoint of suppressing the distortion of the metal wire in a case where the film is adhered to the metal wire, it is preferable that a number density of the above-described filler is higher in the inside than in the surface.

The number density of the filler is measured by the following method.

The film is cut with a microtome to produce a cross-sectional sample. The cross-sectional sample is observed with a scanning electron microscope (approximately 100 times to 300 times). Three or more sites are observed so that the total observation area is 0.5 mm$^2$ or more, and the number of fillers per 1 mm$^2$ is obtained as an average value.

In addition, in a case where the film according to the embodiment of the present disclosure contains the polymer and the filler, it is preferable that the surface of the film contains a filler having an elastic modulus lower than that of the polymer, and it is preferable that the inside of the film contains a filler having an elastic modulus higher than that of the polymer.

As the inorganic filler, a known inorganic filler can be used.

Examples of a material of the inorganic filler include BN, $Al_2O_3$, AlN, $TiO_2$, $SiO_2$, barium titanate, strontium titanate, aluminum hydroxide, calcium carbonate, and a material containing two or more of these.

Among these, as the inorganic filler, from the viewpoint of thermal expansion coefficient and adhesiveness with a metal, metal oxide particles or fibers are preferable, silica particles, titania particles, or glass fibers are more preferable, and silica particles or glass fibers are particularly preferable.

From the viewpoint of thermal expansion coefficient and adhesiveness with a metal, the average particle diameter of the inorganic filler is preferably 5 nm to 20 more preferably 10 nm to 10 still more preferably 20 nm to 1 and particularly preferably 25 nm to 500 nm. In a case where the particles or fibers are flat, the average particle diameter indicates a length in a short side direction.

As the organic filler, a known organic filler can be used.

Examples of a material of the organic filler include polyethylene, polystyrene, urea-formalin filler, polyester, cellulose, acrylic resin, fluororesin, cured epoxy resin, crosslinked benzoguanamine resin, crosslinked acrylic resin, a liquid crystal polymer, and a material containing two or more kinds of these.

In addition, the organic filler may be fibrous, such as nanofibers, or may be hollow resin particles.

Among these, as the organic filler, from the viewpoint of thermal expansion coefficient and adhesiveness with a metal, fluororesin particles, polyester-based resin particles, polyethylene particles, liquid crystal polymer particles, or cellulose-based resin nanofibers are preferable, and polytetrafluoroethylene particles, polyethylene particles, or liquid crystal polymer particles are more preferable.

Here, the liquid crystal polymer particles can be produced, for example, by polymerizing the liquid crystal polymer and crushing the liquid crystal polymer with a crusher or the like to form a powder. The average particle diameter of the liquid crystal polymer particles is preferably smaller than the thickness of each layer.

From the viewpoint of thermal expansion coefficient and adhesiveness with a metal, an average particle diameter of the organic filler is preferably 5 nm to 20 more preferably 10 nm to 1 still more preferably 20 nm to 500 nm, and particularly preferably 25 nm to 90 nm.

The film according to the present disclosure may have a monolayer structure or a multilayer structure. In a case where the film has a monolayer structure, preferred examples thereof include an aspect in which the composition changes from the inside to the surface so that the elastic modulus changes therewith.

It is preferable that the film according to the embodiment of the present disclosure includes a layer A and a layer B provided on at least one surface of the layer A, and an elastic modulus of a surface of the layer B at 160° C. is smaller than the elastic modulus of the inside at 160° C.

In addition, it is preferable that the film according to the embodiment of the present disclosure includes a layer A and a layer B provided on at least one surface of the layer A, and an elastic modulus of a surface of the layer B at 300° C. is smaller than the elastic modulus of the inside at 300° C.

The layer B is preferably a surface layer (outermost layer). It is preferable that the elastic modulus of the layer B at 160° C. is smaller than the elastic modulus of the layer A at 160° C. In addition, it is preferable that the elastic modulus of the layer B at 300° C. is smaller than the elastic modulus of the layer A at 300° C.

In the present disclosure, in a case where the thickness of the layer is 30 μm or less, the "surface" of each layer refers to a region from the outermost surface of the layer to a position corresponding to 10% thickness with respect to the thickness of the layer. In a case where the thickness of the layer is more than 30 μm, the "surface" refers to a region from the outermost surface of the layer to a position separated by 3 μm in the thickness direction.

In the present disclosure, in a case where the thickness of the layer is 30 μm or less, the "inside" of the layer refers to a region from the center of the layer in the thickness direction to a position corresponding to ±5% thickness with respect to the thickness of the layer. In a case where the thickness of the layer is more than 30 μm, the "inside" refers to a region from the center of the layer in the thickness direction to a position separated by ±1.5 μm in the thickness direction.

<Layer A>

The layer A preferably contains a liquid crystal polymer. The layer A may contain only one or two or more kinds of the liquid crystal polymers.

From the viewpoint of thermal expansion coefficient and adhesiveness with a metal, a content of the liquid crystal polymer in the layer A is preferably 20% by volume to 100% by volume, more preferably 20% by volume to 90% by volume, still more preferably 30% by volume to 80% by volume, and particularly preferably 40% by volume to 70% by volume with respect to the total volume of the layer A.

From the viewpoint of making the elastic modulus of the layer A higher than the elastic modulus of the layer B, the layer A preferably contains the filler, more preferably contains a filler having a melting point of 200° C. or higher, and still more preferably contains an inorganic filler.

An average particle diameter of the filler is preferably approximately 20% to approximately 40% of the layer A, and for example, the average particle diameter may be selected from 25%, 30%, or 35% of the thickness of the layer A.

The layer A may contain only one or two or more kinds of the fillers.

From the viewpoint of thermal expansion coefficient and adhesiveness with a metal, a content of the filler in the layer A is preferably 5% by volume to 80% by volume, more preferably 10% by volume to 70% by volume, still more preferably 20% by volume to 70% by volume, and particularly preferably 30% by volume to 60% by volume with respect to the total volume of the layer A.

The layer A may contain an additive other than the liquid crystal polymer and the filler.

Known additives can be used as other additives. Specific examples of the other additives include a leveling agent, an antifoaming agent, an antioxidant, an ultraviolet absorbing agent, a flame retardant, and a colorant.

In addition, the layer A may contain, as the other additives, a resin other than the liquid crystal polymer.

Examples of the resin other than the liquid crystal polymer include thermoplastic resins other than liquid crystal polyester, such as polypropylene, polyamide, polyester other than liquid crystal polyester, polyphenylene sulfide, polyether ketone, polycarbonate, polyethersulfone, polyphenylene ether and a modified product thereof, and polyetherimide; elastomers such as a copolymer of glycidyl methacrylate and polyethylene; and thermosetting resins such as a phenol resin, an epoxy resin, a polyimide resin, and a cyanate resin.

The total content of the other additives in the layer A is preferably 25 parts by mass or less, more preferably 10 parts by mass or less, and still more preferably 5 parts by mass or less with respect to 100 parts by mass of the content of the liquid crystal polymer.

An average thickness of the layer A is not particularly limited, but from the viewpoint of thermal expansion coefficient and adhesiveness with a metal, the average thickness thereof is preferably 5 μm to 90 μm, more preferably 10 μm to 70 μm, and particularly preferably 15 μm to 50 μm.

A method of measuring the average thickness of each layer in the film according to the embodiment of the present disclosure is as follows.

The thickness of each layer is evaluated by cutting the film with a microtome and observing the cross section with an optical microscope. Three or more sites of the cross-sectional sample are cut out, the thickness is measured at three or more points in each cross section, and the average value thereof is defined as the average thickness.

A dielectric loss tangent of the layer A is preferably 0.005 or less and more preferably more than 0 and 0.003 or less.

<Layer B>

The layer B preferably contains a liquid crystal polymer.

Preferred aspects of the liquid crystal polymer which is used in the layer B are the same as the preferred aspects of the liquid crystal polymer which is used in the layer A, except as described below.

The liquid crystal polymer contained in the layer B may be the same as or different from the liquid crystal polymer contained in the layer A. From the viewpoint of making the elastic modulus of the layer B smaller than the elastic modulus of the layer A, it is preferable that the layer B contains a liquid crystal polymer having an elastic modulus lower than that of the liquid crystal polymer contained in the layer A.

From the viewpoint of thermal expansion coefficient and adhesiveness with a metal, it is preferable that a content of the liquid crystal polymer in the layer B is larger than the content of the liquid crystal polymer in the layer A.

In addition, from the viewpoint of thermal expansion coefficient and adhesiveness with a metal, the content of the liquid crystal polymer in the layer B is preferably 50% by volume to 100% by volume, more preferably 80% by volume to 100% by volume, still more preferably 90% by volume to 100% by volume, and particularly preferably 95% by volume to 100% by volume with respect to the total volume of the layer B.

From the viewpoint of making the elastic modulus of the layer A lower than the elastic modulus of the layer B, the layer B preferably contains the filler, more preferably contains a filler having a melting point of lower than 300° C., and still more preferably contains an organic filler.

The layer B may contain only one or two or more kinds of the fillers.

From the viewpoint of thermal expansion coefficient and adhesiveness with a metal, a content of the filler in the layer B is preferably 5% by volume to 80% by volume, more preferably 10% by volume to 70% by volume, still more preferably 20% by volume to 70% by volume, and particularly preferably 30% by volume to 60% by volume with respect to the total volume of the layer B.

The layer B may contain an additive other than the liquid crystal polymer and the filler.

Preferred aspects of other additives which are used in the layer B are the same as the preferred aspects of other additives which are used in the layer A.

From the viewpoint of thermal expansion coefficient and adhesiveness with a metal, it is preferable that an average thickness of the layer B is smaller than the average thickness of the layer A.

From the viewpoint of thermal expansion coefficient and adhesiveness with a metal, a value of $T^A/T^B$, which is a ratio of an average thickness $T^A$ of the layer A to an average thickness $T^B$ of the layer B, is preferably more than 1, more preferably 2 to 100, still more preferably 2.5 to 20, and particularly preferably 3 to 10.

In addition, the average thickness of the layer B can be arbitrarily set according to a thickness of the metal to be bonded to the layer B, but from the viewpoint of adhesiveness with a metal, it is preferable that the average thickness of the layer B is larger than the thickness of the metal. Specifically, the average thickness of the layer B is preferably 0.1 µm to 20 µm, more preferably 0.5 µm to 15 µm, still more preferably 1 µm to 10 µm, and particularly preferably 3 µm to 8 µm.

A dielectric loss tangent of the layer B is preferably 0.01 or less and more preferably more than 0 and 0.005 or less. The dielectric loss tangent of the layer B can be evaluated by scraping off layers other than the layer B from the film. In some cases, the layer B may be scraped off from the film, and the obtained powdery sample may be used for the evaluation.

Preferred aspects of the layer A and the layer B include the following aspects (1) to (4) and a combination of any of (1) to (3) and (4).

(1) Aspect in which the layer A contains a filler having a melting point of 200° C. or higher (preferably an inorganic filler, more preferably an inorganic oxide filler, and particularly preferably silica particles)

(2) Aspect in which the layer B contains a filler having a melting point of lower than 300° C. (preferably an organic filler, more preferably a polyolefin filler, and particularly preferably a polyethylene filler)

(3) Aspect in which the layer A contains a filler having a melting point of 200° C. or higher (preferably an inorganic filler, more preferably an inorganic oxide filler, and particularly preferably silica particles) and the layer B contains a filler having a melting point of lower than 300° C. (preferably an organic filler, more preferably a polyolefin filler, and particularly preferably a polyethylene filler)

(4) Aspect in which the layer B contains a liquid crystal polymer having an elastic modulus lower than that of the liquid crystal polymer contained in the layer A From the viewpoint of thermal expansion coefficient and adhesiveness with a metal, it is preferable that the film according to the embodiment of the present disclosure further includes a layer C in addition to the above-described layer A and the above-described layer B, and it is more preferable that the above-described layer B, the above-described layer A, and the layer C are provided in this order.

<Layer C>

The layer C is preferably a surface layer (outermost layer), and more preferably a surface layer on a side to which the metal is attached.

In addition, in a case where the film according to the embodiment of the present disclosure is used as a laminate having a metal layer (for example, a metal foil or a metal wire), it is preferable that the layer C is disposed between the metal layer and the layer A.

From the viewpoint of thermal expansion coefficient and adhesiveness with a metal, the layer C preferably contains a liquid crystal polymer.

Preferred aspects of the liquid crystal polymer which is used in the layer C are the same as the preferred aspects of the liquid crystal polymer which is used in the layer A, except as described below.

The liquid crystal polymer contained in the layer C may be the same as or different from the liquid crystal polymer contained in the layer A or the layer B, but it is preferable to be the same as the liquid crystal polymer contained in the layer A or the layer B.

From the viewpoint of thermal expansion coefficient and adhesiveness with a metal, it is preferable that a content of the liquid crystal polymer in the layer C is larger than the content of the liquid crystal polymer in the layer A.

In addition, from the viewpoint of thermal expansion coefficient and adhesiveness with a metal, a content of the liquid crystal polymer in the layer C is preferably 50% by volume to 100% by volume, more preferably 80% by volume to 100% by volume, still more preferably 90% by volume to 100% by volume, and particularly preferably 95% by volume to 100% by volume with respect to the total volume of the layer C.

The layer C may contain a filler.

Preferred aspects of the filler which is used in the layer C are the same as the preferred aspects of the filler which is used in the layer A, except as described below.

From the viewpoint of thermal expansion coefficient and adhesiveness with a metal, it is preferable that a content of the filler in the layer C is smaller than a content of the filler in the layer A.

In addition, from the viewpoint of thermal expansion coefficient and adhesiveness with a metal, it is preferable that the layer C does not contain the filler or the content of the filler in the layer C is more than 0% by volume and 20% by volume or less with respect to the total volume of the layer C; it is more preferable that the layer C does not contain the filler or the content of the filler in the layer C is more than 0% by volume and 10% by volume or less with respect to the total volume of the layer C; it is still more preferable that the layer C does not contain the filler or the content of the filler in the layer C is more than 0% by volume and 5% by volume or less with respect to the total volume of the layer C; and it is particularly preferable that the layer C does not contain the filler.

The layer C may contain an additive other than the liquid crystal polymer and the filler.

Preferred aspects of other additives which are used in the layer C are the same as the preferred aspects of other additives which are used in the layer A.

From the viewpoint of thermal expansion coefficient and adhesiveness with a metal, it is preferable that an average thickness of the layer C is smaller than the average thickness of the layer A.

From the viewpoint of thermal expansion coefficient and adhesiveness with a metal, a value of $T^A/T^C$, which is a ratio of an average thickness $T^A$ of the layer A to an average thickness $T^C$ of the layer C, is preferably more than 1, more preferably 2 to 100, still more preferably 2.5 to 20, and particularly preferably 3 to 10.

In addition, from the viewpoint of thermal expansion coefficient and adhesiveness with a metal, a value of $T^C/T^B$, which is a ratio of the average thickness $T^C$ of the layer C to the average thickness $T^B$ of the layer B, is preferably 0.2 to 5, more preferably 0.5 to 2, and particularly preferably 0.8 to 1.2.

Furthermore, from the viewpoint of thermal expansion coefficient and adhesiveness with a metal, the average thickness of the layer C is preferably 0.1 µm to 20 more preferably 0.5 µm to 15 still more preferably 1 µm to 10 and particularly preferably 3 µm to 8 µm.

A dielectric loss tangent of the layer C is preferably 0.005 or less and more preferably more than 0 and 0.003 or less. The dielectric loss tangent of the layer C can be evaluated by scraping off layers other than the layer C from the film. In some cases, the layer C may be scraped off from the film, and the obtained powdery sample may be used for the evaluation.

From the viewpoint of strength and electrical characteristics (characteristic impedance) in a case of being laminated with the metal layer, an average thickness of the film according to the embodiment of the present disclosure is preferably 6 µm to 500 µm, more preferably 6 µm to 100 µm, and particularly preferably 12 µm to 100 µm.

The average thickness of the film is measured at optional five sites using an adhesive film thickness meter, for example, an electronic micrometer (product name, "KG3001A", manufactured by Anritsu Corporation), and the average value of the measured values is defined as the average thickness of the film.

<Method of Manufacturing Film>

(Film Formation)

A method of manufacturing the film according to the embodiment of the present disclosure is not particularly limited, and a known method can be referred to.

Suitable examples of the method of manufacturing the film according to the embodiment of the present disclosure include a casting method, a coating method, and an extrusion method. Among these, a casting method is particularly preferable for forming a relatively thin film, and a co-extrusion method is particularly preferable for forming a thick film. In addition, in a case where the film according to the embodiment of the present disclosure has a multilayer structure, suitable examples thereof include a co-casting method, a multilayer coating method, and a co-extrusion method. Among these, a co-casting method is particularly preferable.

In a case where the multilayer structure in the film is manufactured by the co-casting method or the multilayer coating method, it is preferable that the co-casting method or the multilayer coating method is performed by using a composition for forming the layer A, a composition for forming the layer B, a composition for forming the layer C, or the like obtained by dissolving or dispersing components of each layer in a solvent.

Examples of the solvent include halogenated hydrocarbons such as dichloromethane, chloroform, 1,1-dichloroethane, 1,2-dichloroethane, 1,1,2,2-tetrachloroethane, 1-chlorobutane, chlorobenzene, and o-dichlorobenzene; halogenated phenols such as p-chlorophenol, pentachlorophenol, and pentafluorophenol; ethers such as diethyl ether, tetrahydrofuran, and 1,4-dioxane; ketones such as acetone and cyclohexanone; esters such as ethyl acetate and γ-butyrolactone; carbonates such as ethylene carbonate and propylene carbonate; amines such as triethylamine; nitrogen-containing heterocyclic aromatic compounds such as pyridine; nitriles such as acetonitrile and succinonitrile; amides such as N,N-dimethylformamide, N,N-dimethylacetamide, and N-methylpyrrolidone; urea compounds such as tetramethylurea; nitro compounds such as nitromethane and nitrobenzene; sulfur compounds such as dimethyl sulfoxide and sulfolane; and phosphorus compounds such as hexamethylphosphoramide and tri-n-butyl phosphate. Among these, two or more kinds thereof may be used in combination.

The solvent preferably contains an aprotic compound, particularly, an aprotic compound having no halogen atom for low corrosiveness and easiness to handle. A proportion of the aprotic compound to the whole solvent is preferably 50% by mass to 100% by mass, more preferably 70% by mass to 100% by mass, and particularly preferably 90% by mass to 100% by mass. In addition, from the viewpoint of easily dissolving the liquid crystal polymer, as the above-described aprotic compound, an amide such as N,N-dimethylformamide, N,N-dimethylacetamide, tetramethylurea, and N-methylpyrrolidone, or an ester such as γ-butyrolactone is preferable; and N,N-dimethylformamide, N,N-dimethylacetamide, or N-methylpyrrolidone is more preferable.

In addition, as the solvent, it is preferable to contain a compound having a dipole moment of 3 to 5, because the liquid crystal polymer can be easily dissolved. A proportion of the compound having a dipole moment of 3 to 5 to the whole solvent is preferably 50% by mass to 100% by mass, more preferably 70% by mass to 100% by mass, and particularly preferably 90% by mass to 100% by mass.

It is preferable to use the compound having a dipole moment of 3 to 5 as the above-described aprotic compound.

In addition, from the viewpoint of ease removal, the solvent preferably contains a compound having a boiling point of 220° C. or lower at 1 atm, and a proportion of the compound having a boiling point of 220° C. or lower at 1 atm in the entire solvent is preferably 50% by mass to 100% by mass, more preferably 70% by mass to 100% by mass, and particularly preferably 90% by mass to 100% by mass.

It is preferable to use the compound having a boiling point of 220° C. or lower at 1 atm as the above-described aprotic compound.

In addition, in a case where the film is manufactured by the co-casting method, the multilayer coating method, the co-extrusion method, or the like described above, a support may be used in the method of manufacturing the film according to the embodiment of the present disclosure.

Examples of the support include a metal drum, a metal band, a glass plate, a resin film, and a metal foil. Among these, the support is preferably a metal drum, a metal band, or a resin film.

Examples of the resin film include a polyimide (PI) film. Examples of commercially available products of the resin film include U-PILEX S and U-PILEX R (manufactured by Ube Corporation), KAPTON (manufactured by Du Pont-Toray Co., Ltd.), and IF30, IF70, and LV300 (manufactured by SKC Kolon PI, Inc.).

In addition, the support may have a surface treatment layer formed on the surface so that the support can be easily peeled off. Hard chrome plating, a fluororesin, or the like can be used as the surface treatment layer.

An average thickness of the support is not particularly limited, but is preferably 25 μm or more and 75 μm or less and more preferably 50 μm or more and 75 μm or less.

In addition, a method for removing at least a part of the solvent from a cast or applied film-like composition (a coating film) is not particularly limited, and a known drying method can be used.

(Stretching)

In the film according to the embodiment of the present disclosure, stretching can be combined as appropriate from the viewpoint of controlling molecular alignment and adjusting thermal expansion coefficient and mechanical properties. The stretching method is not particularly limited, and a known method can be referred to, and the stretching method may be carried out in a solvent-containing state or in a dry film state. The stretching in the solvent-containing state may be carried out by gripping and stretching the film, or may be carried out by utilizing self-contraction due to drying without stretching. The stretching is particularly effective for the purpose of improving the breaking elongation and the breaking strength, in a case where brittleness of the film is reduced by addition of an inorganic filler or the like.

(Heat Treatment)

The method of manufacturing the film according to the embodiment of the present disclosure preferably includes a step of heat-treating (annealing) the film after the film formation.

From the viewpoint of dielectric loss tangent and peel strength, the heat treatment temperature in the above-described step of heat-treating is preferably 260° C. to 370° C., more preferably 280° C. to 360° C., and still more preferably 300° C. to 350° C. The heat treatment time is preferably 15 minutes to 10 hours and more preferably 30 minutes to 5 hours.

In addition, the method of manufacturing the film according to the embodiment of the present disclosure may include other known steps as necessary.

<Applications>

The film according to the embodiment of the present disclosure can be used for various applications. Among the various applications, the film according to the embodiment of the present disclosure can be used suitably as a film for an electronic component such as a printed wiring board and more suitably for a flexible printed circuit board.

In addition, the film according to the embodiment of the present disclosure can be suitably used as a metal adhesive film.

(Laminate)

It is sufficient that the laminate according to the embodiment of the present disclosure is a laminate in which the film according to the embodiment of the present disclosure is laminated. It is preferable that the laminate according to the embodiment of the present disclosure includes the film according to the embodiment of the present disclosure and a metal layer disposed on a surface of the above-described layer A side of the film, and it is more preferable that the metal layer is a copper layer. Since the metal layer is disposed on the surface of the layer A side, the layer B is the outermost surface layer in the laminate.

In addition, it is preferable that the laminate according to the embodiment of the present disclosure includes the film according to the embodiment of the present disclosure and a metal layer disposed on a surface of the above-described layer B side of the film, and it is more preferable that the metal layer is a copper layer.

The metal layer disposed on the surface of the above-described layer B side is preferably a metal layer disposed on the surface of the above-described layer B.

In addition, it is preferable that the laminate according to the embodiment of the present disclosure includes the film according to the embodiment of the present disclosure in which the layer B, the layer A, and the layer C are provided in this order, a metal layer disposed on a surface of the above-described layer B side of the film, and a metal layer disposed on a surface of the above-described layer C side of the film; and it is more preferable that both of the metal layers are copper layers.

It is preferable that the metal layer disposed on the surface of the above-described layer C side is a metal layer disposed on the surface of the above-described layer C, and it is more preferable that the metal layer disposed on the surface of the above-described layer B side is a metal layer disposed on the surface of the above-described layer B, and the metal layer disposed on the surface of the above-described layer C side is a metal layer disposed on the surface of the above-described layer C.

In addition, the metal layer disposed on the surface of the above-described layer B side and the metal layer disposed on the surface of the above-described layer C side may be a metal layer having the same material, thickness, and shape, or may be metal layers having different materials, thicknesses, and shapes. From the viewpoint of adjusting the characteristic impedance, the metal layer disposed on the surface of the above-described layer B side and the metal layer disposed on the surface of the above-described layer C side may be metal layers having different materials or thicknesses, or a metal layer may be laminated on only one side of the layer B or the layer C.

Furthermore, from the viewpoint of adjusting the characteristic impedance, preferred examples thereof also include an aspect in which a metal layer is laminated on one side of the layer B or the layer C, and another film (preferably, another liquid crystal polymer film) is laminated on the other side.

In a case where the above-described metal layer disposed on the surface of the above-described layer B side is a copper layer disposed on the surface of the above-described layer B, a peel strength between the above-described layer B and the copper layer is preferably 0.5 kN/m or more, more preferably 0.7 kN/m or more, still more preferably 0.7 kN/m to 2.0 kN/m, and particularly preferably 0.9 kN/m to 1.5 kN/m.

In addition, in a case where the above-described metal layer disposed on the surface of the above-described layer C side is a copper layer disposed on the surface of the above-described layer C, a peel strength between the above-described layer C and the copper layer is preferably 0.5 kN/m or more, more preferably 0.7 kN/m or more, still more preferably 0.7 kN/m to 2.0 kN/m, and particularly preferably 0.9 kN/m to 1.5 kN/m.

In the present disclosure, the peel strength between the layer B or layer C of the film and the metal layer (for example, the copper layer) is measured by the following method.

A peeling test piece with a width of 1.0 cm is produced from the laminate of the film and the metal layer, the film is fixed to a flat plate with double-sided adhesive tape, and the strength (kN/m) in a case of peeling the metal layer off from the film at a rate of 50 mm/min is measured by the 180° method in conformity with JIS C 5016 (1994).

The metal layer is preferably a copper layer. As the copper layer, a rolled copper foil formed by a rolling method or an electrolytic copper foil formed by an electrolytic method is preferable, and a rolled copper foil is more preferable from the viewpoint of bending resistance.

An average thickness of the metal layer (preferably the copper layer) is not particularly limited, but is preferably 2 µm to 20 µm, more preferably 3 µm to 18 µm, and still more preferably 5 µm to 12 µm. The metal layer may be a metal layer with a carrier formed on a support (carrier) so as to be peelable. As the carrier, a known carrier can be used. An average thickness of the carrier is not particularly limited, but is preferably 10 µm to 100 µm and more preferably 18 µm to 50 µm.

From the viewpoint of suppressing the distortion of the metal wire in a case where the film is adhered to the metal wire, it is preferable that a thickness of the layer B is larger than a thickness of the metal layer (for example, the copper layer).

The metal layer in the laminate according to the embodiment of the present disclosure may be a metal layer having a circuit pattern.

It is also preferable that the metal layer in the laminate according to the embodiment of the present disclosure is processed into, for example, a desired circuit pattern by etching to form a flexible printed circuit board. The etching method is not particularly limited, and a known etching method can be used.

EXAMPLES

Hereinafter, the present disclosure will be described in more detail with reference to examples. The materials, the used amounts, the proportions, the treatment contents, the treatment procedures, and the like described in the following examples can be appropriately changed without departing from the gist of the present disclosure. Therefore, the scope of the present disclosure is not limited to the following specific examples.

<<Measurement Method>>
[Dielectric Loss Tangent]

The dielectric loss tangent was measured by a resonance perturbation method at a frequency of 10 GHz. A 10 GHz cavity resonator (CP531 of Kanto Electronics Application & Development Inc.) was connected to a network analyzer ("E8363B" manufactured by Agilent Technology), a sample (width: 2.0 mm×length: 80 mm) of the film was inserted into the cavity resonator, and the dielectric loss tangent of the film was measured based on a change in resonance frequency for 96 hours before and after the insertion in an environment of a temperature of 25° C. and a humidity of 60% RH.

[Elastic Modulus and Loss Tangent]

A sample for evaluating a cross section was produced by embedding the film in a UV resin and cutting the film with a microtome. Subsequently, the storage elastic modulus and the loss tangent (loss elastic modulus/storage elastic modulus) of the surface and the inside were calculated by observing the sample in a VE-AFM mode using a scanning probe microscope (SPA400, manufactured by Hitachi High-Tech Science Corporation).

[Thermal Expansion Coefficient]

A tensile load of 1 g was applied to both ends of a film having a width of 5 mm and a length of 20 mm, and a thermal expansion coefficient (=linear expansion coefficient of the film) was calculated from the inclination of TMA curve between 30° C. and 150° C. using a thermomechanical analyzer (TMA) in a case where the temperature is raised from 25° C. to 200° C. at a rate of 5° C./min, lowered to 30° C. at a rate of 20° C./min, and raised again at a rate of 5° C./min.

[Peel Strength]

A peeling test piece with a width of 1.0 cm was produced from the laminate of the film and the copper foil, the film was fixed to a flat plate with double-sided adhesive tape, and the strength (kN/m) in a case of peeling the copper foil off from the film at a rate of 50 mm/min was measured by the 180° method in conformity with JIS C 5016 (1994). A peel strength between the layer B side of the film and the copper foil was evaluated by fixing a surface opposite to the layer B with a double-sided adhesive tape. A peel strength between the layer C side of the film and the copper foil was evaluated by fixing a surface opposite to the layer C with a double-sided adhesive tape.

<<Production Example>>
<Polymer>

LC-A: Liquid crystal polymer produced by production method described below
—Production of LC-A—

940.9 g (5.0 mol) of 6-hydroxy-2-naphthoic acid, 377.9 g (2.5 mol) of 4-hydroxyacetaminophen, 415.3 g (2.5 mol) of isophthalic acid, and 867.8 g (8.4 mol) of acetic acid anhydride were added to a reactor provided with a stirrer, a torque meter, a nitrogen gas introduction pipe, a thermometer, and a reflux condenser, the gas inside the reactor was replaced with nitrogen gas, and the mixture was heated from room temperature (23° C.) to 140° C. over 60 minutes while being stirred in a nitrogen gas stream and was refluxed at 140° C. for 3 hours.

Thereafter, the mixture was heated from 150° C. to 300° C. over 5 hours while distilling off by-product acetic acid and unreacted acetic acid anhydride and maintained at 300° C. for 30 minutes, and the resultant was taken out from the reactor and cooled to room temperature. The obtained solid matter was crushed with a crusher, thereby obtaining powdery liquid crystal polyester (A1). The flow start temperature of the liquid crystal polyester (A1) was 193.3° C.

The liquid crystal polyester (A1) obtained above was heated from room temperature to 160° C. over 2 hours and 20 minutes in a nitrogen atmosphere, further heated from 160° C. to 180° C. over 3 hours and 20 minutes, maintained at 180° C. for 5 hours to carry out solid phase polymerization, cooled, and crushed with a crusher, thereby obtaining powdery liquid crystal polyester (A2). The flow start temperature of the liquid crystal polyester (A2) was 220° C.

The liquid crystal polyester (A2) obtained above was heated from room temperature (23° C.) to 180° C. over 1 hour and 25 minutes in a nitrogen atmosphere, further heated from 180° C. to 255° C. over 6 hours and 40 minutes, maintained at 255° C. for 5 hours to carry out solid phase polymerization, and cooled, thereby obtaining powdery liquid crystal polyester (A) (LC-A). A flow start temperature of the liquid crystal polyester (B) was 302° C. In addition, in a case where a melting point of the liquid crystal polyester (A) was measured using a differential scanning calorimetry device, the measured value was 311° C.

LC-B: Liquid crystal polymer produced by production method described below
—Production of LC-B—

940.9 g (5.0 mol) of 6-hydroxy-2-naphthoic acid, 377.9 g (2.5 mol) of 4-hydroxyacetaminophen, 415.3 g (2.5 mol) of isophthalic acid, and 867.8 g (8.4 mol) of acetic acid anhydride were added to a reactor provided with a stirrer, a torque meter, a nitrogen gas introduction pipe, a thermometer, and a reflux condenser, the gas inside the reactor was replaced with nitrogen gas, and the mixture was heated from room temperature (23° C.) to 143° C. over 60 minutes while being stirred in a nitrogen gas stream and was refluxed at 143° C. for 1 hour.

Thereafter, the mixture was heated from 150° C. to 300° C. over 5 hours while distilling off by-product acetic acid and unreacted acetic acid anhydride and maintained at 300° C. for 30 minutes, and the resultant was taken out from the reactor and cooled to room temperature. The obtained solid matter was crushed with a crusher, thereby obtaining powdery liquid crystal polyester (B1). A flow start temperature of the liquid crystal polyester (B1) was 191° C.

The liquid crystal polyester (B1) obtained above was heated from room temperature to 160° C. over 2 hours and 20 minutes in a nitrogen atmosphere, further heated from 160° C. to 180° C. over 3 hours and 20 minutes, maintained at 180° C. for 5 hours to carry out solid phase polymerization, cooled, and crushed with a crusher, thereby obtaining powdery liquid crystal polyester (B2). The flow start temperature of the liquid crystal polyester (B2) was 220° C.

The liquid crystal polyester (B2) obtained above was heated from room temperature (23° C.) to 180° C. over 1 hour and 20 minutes in a nitrogen atmosphere, further heated from 180° C. to 240° C. over 5 hours, maintained at 240° C. for 5 hours to carry out solid phase polymerization, and cooled, thereby obtaining powdery liquid crystal polyester (B) (LC-B). A flow start temperature of the liquid crystal polyester (B) was 285° C.

LC-C: Liquid crystal polymer produced by production method described below
—Production of LC-C—

1034.99 g (5.5 mol) of 6-hydroxy-2-naphthoic acid, 378.33 g (1.75 mol) of 2,6-naphthalenedicarboxylic acid, 83.07 g (0.5 mol) of terephthalic acid, 272.52 g (2.475 mol;

0.225 mol excess with respect to the total molar amount of 2,6-naphthalenedicarboxylic acid and terephthalic acid) of hydroquinone, 1226.87 g (12 mol) of acetic acid anhydride, and 0.17 g of 1-methylimidazole as a catalyst were added to a reactor provided with a stirrer, a torque meter, a nitrogen gas introduction pipe, a thermometer, and a reflux condenser. After the gas in the reactor was replaced with nitrogen gas, the mixture was heated from room temperature to 145° C. over 15 minutes while being stirred in a nitrogen gas stream and was refluxed at 145° C. for 1 hour.

Next, the mixture was heated from 145° C. to 310° C. over 3 hours 30 minutes while distilling off by-product acetic acid and unreacted acetic acid anhydride and maintained at 310° C. for 3 hours, and solid liquid crystal polyester (C1) was taken out and cooled to room temperature. A flow start temperature of the polyester (C1) was 265° C.

[Production of Liquid Crystal Polyester Fine Particles (LC-C)]

Using a jet mill ("KJ-200" of KURIMOTO Ltd.), the liquid crystal polyester (C1) was crushed to obtain liquid crystal polyester fine particles (LC-C). An average particle diameter of the liquid crystal polyester fine particles was 9 μm.

LC-D: Liquid crystal polymer produced by production method described below

—Production of LC-D—

941 g (5.0 mol) of 6-hydroxy-2-naphthoic acid, 273 g (2.5 mol) of 4-aminophenol, 415 g (2.5 mol) of isophthalic acid, and 1123 g (11 mol) of acetic acid anhydride were added to a reactor provided with a stirrer, a torque meter, a nitrogen gas introduction pipe, a thermometer, and a reflux condenser, the gas inside the reactor was replaced with nitrogen gas, and the mixture was heated from room temperature (23° C.) to 150° C. over 15 minutes while being stirred in a nitrogen gas stream and was refluxed at 150° C. for 3 hours.

Thereafter, the mixture was heated from 150° C. to 320° C. over 3 hours while distilling off by-product acetic acid and unreacted acetic acid anhydride and maintained until an increase in viscosity was observed, and the resultant was taken out from the reactor and cooled to room temperature. The obtained solid matter was crushed with a crusher, thereby obtaining powdery liquid crystal polyester (D1).

The liquid crystal polyester (D1) obtained above was maintained at 250° C. for 3 hours in a nitrogen atmosphere to carry out solid phase polymerization, cooled, and crushed with a crusher, thereby obtaining powdery liquid crystal polyester (LC-D).

[Polyphenylene Ether]

P-1: Mixture of pellets of commercially available polyphenylene ether (SA120, manufactured by SABIC; weight-average molecular weight Mw: 2,600)/bisphenol A-type epoxy resin (EPICLON 850S, manufactured by DIC Corporation; average number of epoxy groups: 2)/bisphenol A-type cyanate ester resin (Badcy, manufactured by LONZA KK.)/aromatic condensed phosphate ester (PX-200, manufactured by DAIHACHI CHEMICAL INDUSTRY CO., LTD.)/tris(diethylphosphinyloxy) aluminum (EXOLIT OP-935, manufactured by CLARIANT Japan)/zinc octoate=25/34/25/8/8/0.01 (mass ratio)

<Curable Compound>

M-1: Commercially available aminophenol-type epoxy resin (jER630LSD, manufactured by Mitsubishi Chemical Corporation.) was used so that the amount of solid content was the amount shown in Table 1.

M-2: Commercially available thermosetting resin (SLK containing mainly a polymer-type curable compound, manufactured by Shin-Etsu Chemical Co., Ltd.) was used so that the amount of solid content was the amount shown in Table 1.

<Filler>

A-1: Commercially available ultrahigh-molecular-weight polyethylene fine particles having an average particle diameter of 10 μm (Mipelon PM200, manufactured by Mitsui Chemicals, Inc.) were used so that the amount of solid content was the amount shown in Table 1.

F-1: Commercially available hydrophobic silica sol having an average particle diameter of 45 nm (MEK-ST-L, solid content: 30% by mass, methyl ethyl ketone (MEK) solvent, manufactured by Nissan Chemical Industries Ltd.) was used so that the amount of solid content was the amount shown in Table 1.

F-2: Commercially available silica fine particles having an average particle diameter of 0.5 μm (SO-C2, manufactured by Admatechs) were used so that the amount of solid content was the amount shown in Table 1.

F-3: Mixture of LC-C and F-2 (mass ratio: 1:1) was used so that the amount of solid content was the amount shown in Table 1.

F-4: Solvent of commercially available polytetrafluoroethylene (PTFE) nanoparticles (Polyflon PTFE D-210C, average particle diameter: 0.25 μm, manufactured by DAIKIN INDUSTRIES, LTD.) was replaced with an N-methylpyrrolidone solvent, and used so that the solid content in the liquid crystal polymer film was the amount shown in Table 1.

F-5: Copolymer particles of ethylene tetrafluoride and perfluoroalkoxy ethylene (PFA) (melting point: 280° C., average particle diameter: 0.2 μm to 0.5 μm, dielectric loss tangent: 0.001)

F-6: Commercially available hollow powder having an average particle diameter of 16 μm (glass bubbles iM30K, manufactured by 3M Japan Limited)

F-7: Boron nitride particles (melting point >500° C., HP40MF100 (manufactured by Mizushima Ferroalloy Co., Ltd.), dielectric loss tangent: 0.0007)

<Film Formation>

A film was formed according to the following co-casting or multilayer coating.

[Co-Casting (Solution Film Formation)]

—Preparation of Polymer Solution—

The above-described liquid crystal polymer and the additive were added to N-methylpyrrolidone, and the mixture was stirred at 140° C. for 4 hours in a nitrogen atmosphere, thereby obtaining a liquid crystal polymer solution. The liquid crystal polymer and the additive were added thereto in the volume ratios shown in Table 1. Concentrations of solid contents of the solutions for the layer B (surface layer), for the layer A (core layer), and for the layer C (support layer) were each set to the concentration shown in Table 1.

Subsequently, first, the solution was allowed to pass through a sintered fiber metal filter having a nominal pore diameter of 10 μm and allowed to pass through a sintered fiber metal filter having the same nominal pore diameter of 10 μm, thereby obtaining each liquid crystal polymer solution.

In a case where the additive was not dissolved in N-methylpyrrolidone, a liquid crystal polymer solution was prepared without adding the additive, the mixture was allowed to pass through the above-described sintered fiber metal filter, and then the additive was added thereto and stirred.

Production of Single-Sided Copper-Clad Laminated Plate (Examples 1 to 4 and Comparative Example 1)

The obtained polymer solutions for the layer A and for the layer B were fed to a casting die equipped with a feedblock adapted for co-casting, and cast onto a treated surface of a copper foil (manufactured by FUKUDA METAL FOIL & POWER CO., LTD., CF-T9DA-SV-12, average thickness: 12 μm) so that the layer A was in contact with the copper foil. The polymer solutions were dried at 40° C. for 4 hours to remove the solvent from the casting film. Further, by holding the casting film at 300° C. for 3 hours in a nitrogen atmosphere, a laminate (single-sided copper-clad laminated plate) having a copper layer and a film was obtained.

—Production of Double-Sided Copper-Clad Laminated Plate—

(Copper-Clad Laminated Plate Precursor Step)

A copper foil (manufactured by FUKUDA METAL FOIL & POWER CO., LTD., CF-T9DA-SV-12, average thickness: 12 μm) was placed on the single-sided copper-clad laminated plate such that a treated surface of the copper foil was in contact with the film, and using a laminator ("Vacuum laminator V-130" manufactured by Nikko-Materials Co., Ltd.), lamination was performed for 1 minute under conditions of 140° C. and a laminating pressure of 0.4 MPa, thereby obtaining a double-sided copper foil laminated plate precursor.

Production of Single-Sided Copper-Clad Laminated Plate (Examples 5 to 20)

The obtained polymer solutions for the layer B (surface layer), for the layer A (core layer), and for the layer C (support layer) were fed to a casting die equipped with a feedblock adapted for co-casting, and cast onto a treated surface of a copper foil (manufactured by FUKUDA METAL FOIL & POWER CO., LTD., CF-T9DA-SV-18, average thickness: 18 μm) so that the layer C was in contact with the copper foil. The polymer solutions were dried at 40° C. for 4 hours to remove the solvent from the casting film, and by holding the casting film at 300° C. for 3 hours in a nitrogen atmosphere, a laminate (single-sided copper-clad laminated plate) having a copper layer and a film was obtained.

[Multilayer Coating]

—Preparation of Polymer Solution—

The polymer shown in Table 1 and the additive shown in Table 1 were added to toluene, and the mixture was stirred for 60 minutes to obtain polymer solutions for the layer A and the layer B, respectively.

Production of Single-Sided Copper-Clad Laminated Plate (Example 21)

The polymer solutions for the layer A and the layer B were fed to a slot die coater equipped with a slide coater, and applied onto a treated surface of a copper foil (manufactured by FUKUDA METAL FOIL & POWER CO., LTD., CF-T9DA-SV-18, thickness: 18 μm, surface roughness Rz of a treated surface: 0.85 μm) for multilayer coating. After drying at 100° C. for 3 minutes, the coating film was dried at 170° C. for 3 minutes to remove the solvent from the coating film. Thereafter, the temperature was raised from room temperature to 200° C. at 1° C./min, and a heat treatment was performed at the temperature for 2 hours to obtain a laminate having a copper layer (single-sided copper-clad laminated plate).

(Main Thermocompression Step)

Using a thermocompression machine ("MP-SNL" manufactured by Toyo Seiki Seisaku-sho, Ltd.), the obtained copper-clad laminated plate precursor was subjected to thermocompression under conditions of 300° C. and 4.5 MPa for 10 minutes to produce a double-sided copper-clad laminated plate.

<Production of Flexible Wiring Board>

Using the single-sided copper-clad laminated plate and the double-sided copper-clad laminated plate described above, a flexible wiring board having a four-layered stripline structure with an outer-layer plane (ground layer) was produced.

(Step of Forming Wiring Base Material)

The copper foil of the above-described double-sided copper-clad laminated plate was patterned by a known photofabrication method to produce a wiring base material including three pairs of signal lines. A length of the signal line was 100 mm, and a width of the signal line was set such that characteristic impedance was 50Ω.

(Lamination Step)

Using the above-described wiring base material and a pair of the above-described single-sided copper-clad laminated plates, a laminate of single-sided copper-clad laminated plate/wiring base material/single-sided copper-clad laminated plate was formed such that the wiring base material was in contact with the film side of the single-sided copper-clad laminated plate. Using a vacuum press apparatus, the lamination was performed at a press temperature shown in Table 1 to produce a flexible wiring board.

Evaluation regarding distortion of wiring line was performed using the produced flexible wiring board. The evaluation methods were as follows. The evaluation results are shown in Table 1.

<Wiring Distortion>

The flexible wiring board was cut with a microtome, the cross section was observed with an optical microscope, and the distortion of the wiring line was evaluated based on the following evaluation standard.

A: No distortion was recognized in the signal lines and the ground line.

B: While no distortion was recognized in the signal lines, distortion was recognized in the ground line.

C: Distortion was recognized in a pair of signal lines.

D: Distortion was recognized in two pairs or three pairs of signal lines.

TABLE 1

| | Layer B (surface layer) | | | | | | | | | | | Layer A (core layer) | | | | | | | |
|---|---|---|---|---|---|---|---|---|---|---|---|---|---|---|---|---|---|---|---|
| | Polymer | | Additive | | Solid content Concentration | Elastic modulus (GPa) | | Loss tangent | | Thickness (μm) | | Polymer | | Additive | | Solid content Concentration | Elastic modulus (GPa) | | Thickness (μm) |
| | Type | Content (% by volume) | Type | Content (% by volume) | (% by mass) | 160° C. | 300° C. | 160° C. | 300° C. | | Type | Content (% by volume) | Type | Content (% by volume) | (% by mass) | 160° C. | 300° C. | |
| Example 1 | LC-A | 50 | A-1 | 50 | 20 | 0.6 | 0.2 | 0.3 | >0.1 | 13 | LC-A | 100 | — | — | 23 | 0.9 | 0.4 | 37 |
| Example 2 | LC-A | 50 | A-1 | 50 | 20 | 0.6 | 0.2 | 0.3 | >0.1 | 13 | LC-A | 100 | — | — | 23 | 0.9 | 0.4 | 37 |
| Example 3 | LC-A | 50 | A-1 | 50 | 20 | 0.6 | 0.2 | 0.3 | >0.1 | 13 | LC-A | 50 | F-1 | 50 | 23 | 2.3 | 1.1 | 37 |
| Example 4 | LC-A | 100 | — | — | 20 | 0.9 | 0.4 | 0.02 | 0.08 | 13 | LC-A | 50 | F-1 | 50 | 23 | 2.3 | 1.1 | 37 |
| Example 5 | LC-B | 50 | A-1 | 50 | 33 | 0.6 | 0.2 | 0.3 | >0.1 | 25 | LC-B | 50 | F-1 | 50 | 35 | 2.3 | 1.1 | 32 |
| Example 6 | LC-B | 50 | A-1 | 50 | 33 | 0.6 | 0.2 | 0.3 | >0.1 | 25 | LC-B | 50 | F-1 | 50 | 35 | 2.3 | 1.1 | 32 |
| Example 7 | LC-B | 50 | A-1 | 50 | 33 | 0.6 | 0.2 | 0.3 | >0.1 | 25 | LC-B | 50 | F-2 | 50 | 35 | 2.3 | 1.1 | 32 |
| Example 8 | LC-B | 50 | A-1 | 50 | 33 | 0.6 | 0.2 | 0.3 | >0.1 | 25 | LC-B | 50 | F-3 | 50 | 35 | 1.6 | 0.7 | 32 |
| Example 9 | LC-B | 50 | A-1 | 50 | 33 | 0.6 | 0.2 | 0.3 | >0.1 | 25 | LC-C | 50 | — | — | 35 | 0.9 | 0.2 | 32 |
| Example 10 | LC-B | 25 | A-1 | 75 | 23 | 0.3 | 0.1 | 0.6 | >0.1 | 13 | LC-B | 25 | F-3 | 75 | 26 | 2.4 | 0.9 | 29 |
| Example 11 | LC-B | 25 | A-1 | 75 | 23 | 0.3 | 0.1 | 0.6 | >0.1 | 25 | LC-B | 25 | F-3 | 75 | 26 | 2.4 | 0.9 | 32 |
| Example 12 | LC-B | 25 | A-1 | 75 | 23 | 0.3 | 0.1 | 0.6 | >0.1 | 35 | LC-B | 25 | F-3 | 75 | 26 | 2.4 | 0.9 | 42 |
| Example 13 | LC-B | 25 | A-1 | 75 | 23 | 0.3 | 0.1 | 0.6 | >0.1 | 35 | LC-A | 50 | F-3 | 50 | 15 | 2.3 | 1.1 | 37 |
| Example 14 | LC-B | 25 | A-1 M-1 | 70 5 | 20 | 0.3 | 0.1 | 0.6 | >0.1 | 35 | LC-B | 50 | — | — | 15 | 0.9 | 0.2 | 32 |
| Example 15 | LC-B | 25 | A-1 M-1 | 70 5 | 20 | 0.3 | 0.1 | 0.6 | >0.1 | 35 | LC-C | 50 | F-3 | 50 | 15 | 1.6 | 0.7 | 42 |
| Example 16 | LC-B | 50 | A-1 | 50 | 33 | 0.3 | 0.1 | 0.6 | >0.1 | 35 | LC-B | 50 | F-4 | 50 | 15 | 0.7 | 0.3 | 42 |
| Example 17 | LC-B | 50 | A-1 | 50 | 13 | 0.3 | 0.1 | 0.6 | >0.1 | 35 | LC-B | 50 | F-5 | 50 | 15 | 0.7 | 0.3 | 42 |
| Example 18 | LC-B | 25 | A-1 M-1 | 70 5 | 20 | 0.3 | 0.1 | 0.6 | >0.1 | 35 | LC-B | 50 | F-6 | 50 | 15 | 2.3 | 1.1 | 42 |
| Example 19 | LC-B | 25 | A-1 M-1 | 70 5 | 20 | 0.3 | 0.1 | 0.6 | >0.1 | 35 | LC-B | 50 | F-7 | 50 | 15 | 2.3 | 1.1 | 42 |
| Example 20 | LC-D | 25 | A-1 | 75 | 23 | 0.3 | 0.1 | 0.6 | >0.1 | 35 | LC-D | 25 | F-3 | 75 | 26 | 2.4 | 0.9 | 42 |
| Example 21 | P-1 | 25 | A-1 M-1 | 70 5 | 80 | 0.3 | 0.1 | 0.4 | >0.1 | 35 | P-1 | 50 | F-2 | 50 | 80 | 3.0 | 1.2 | 42 |
| Comparative Example 1 | LC-A | 100 | — | — | 20 | 0.9 | 0.4 | 0.02 | 0.08 | 13 | LC-A | 100 | — | — | 2.1 | 0.9 | 0.4 | 37 |

TABLE 1-continued

| | Layer C (support layer) | | | | | | | | | Evaluation result | | |
|---|---|---|---|---|---|---|---|---|---|---|---|---|
| | Polymer | | Additive | | Solid content Concentration (% by mass) | Elastic modulus (GPa) | | Thickness (μm) | Press temperature (°C) | Film | | Laminate Distortion of wiring line |
| | Type | Content (% by volume) | Type | Content (% by volume) | | 160° C. | 300° C. | | | Dielectric loss tangent | Linear expression coefficient (ppm/K) | |
| Example 1 | — | — | — | — | — | — | — | — | 300 | 0.003 | 35 | C |
| Example 2 | — | — | — | — | — | — | — | — | 160 | 0.003 | 35 | B |
| Example 3 | — | — | — | — | — | — | — | — | 300 | 0.002 | 20 | A |
| Example 4 | — | — | — | — | — | — | — | — | 160 | 0.002 | 18 | B |
| Example 5 | LC-B | 95 | M-1 | 5 | 8 | 0.9 | 0.4 | 3 | 160 | 0.002 | 20 | A |
| Example 6 | LC-B | 95 | M-2 | 5 | 8 | 0.9 | 0.4 | 3 | 160 | 0.002 | 20 | A |
| Example 7 | LC-B | 95 | M-1 | 5 | 8 | 0.9 | 0.4 | 3 | 160 | 0.002 | 20 | A |
| Example 8 | LC-B | 95 | M-1 | 5 | 8 | 0.9 | 0.4 | 3 | 160 | 0.002 | 35 | B |
| Example 9 | LC-B | 95 | M-1 | 5 | 8 | 0.9 | 0.4 | 3 | 160 | 0.002 | 50 | B |
| Example 10 | LC-B | 95 | M-1 | 5 | 8 | 0.9 | 0.4 | 3 | 160 | 0.001 | 50 | A |
| Example 11 | LC-B | 95 | M-1 | 5 | 8 | 0.9 | 0.4 | 3 | 160 | 0.001 | 50 | A |
| Example 12 | LC-B | 95 | M-1 | 5 | 8 | 0.9 | 0.4 | 3 | 160 | 0.001 | 50 | A |
| Example 13 | LC-B | 95 | M-1 | 5 | 8 | 0.9 | 0.4 | 3 | 160 | 0.002 | 20 | A |
| Example 14 | LC-B | 95 | M-1 | 5 | 8 | 0.9 | 0.4 | 3 | 160 | 0.002 | 48 | A |
| Example 15 | LC-B | 95 | M-1 | 5 | 8 | 0.9 | 0.4 | 3 | 160 | 0.002 | 48 | A |
| Example 16 | LC-B | 95 | M-1 | 5 | 8 | 0.9 | 0.4 | 3 | 160 | 0.001 | 46 | B |
| Example 17 | LC-B | 95 | M-1 | 5 | 8 | 0.9 | 0.4 | 3 | 160 | 0.002 | 43 | B |
| Example 18 | LC-B | 95 | M-1 | 5 | 8 | 0.9 | 0.4 | 3 | 160 | 0.003 | 20 | A |
| Example 19 | LC-B | 95 | M-1 | 5 | 8 | 0.9 | 0.4 | 3 | 160 | 0.002 | 20 | A |
| Example 20 | LC-B | 95 | M-1 | 5 | 8 | 0.9 | 0.4 | 3 | 160 | 0.002 | 49 | A |
| Example 21 | — | — | — | — | — | — | — | — | 160 | 0.005 | 20 | A |
| Comparative Example 1 | — | — | — | — | — | — | — | — | 300 | 0.003 | 33 | D |

As shown in Table 1, in Examples 1 to 21, since the dielectric loss tangent was 0.005 or less and the elastic modulus of the surface at 160° C. was smaller than the elastic modulus of the inside at 160° C., it was found that the distortion of the wiring line was suppressed.

In addition, in Examples 1 to 21, since the dielectric loss tangent was 0.005 or less and the elastic modulus of at least one surface at 300° C. was smaller than the elastic modulus of the inside at 300° C., it was found that the distortion of the wiring line was suppressed.

On the other hand, in Comparative Example 1, since the elastic modulus of the surface at 160° C. was the same as the elastic modulus of the inside at 160° C., it was found that the distortion of the wiring line occurred.

In addition, in Comparative Example 1, since the elastic modulus of the surface at 300° C. was the same as the elastic modulus of the inside at 300° C., it was found that the distortion of the wiring line occurred.

With regard to the laminate of Example 14, the peel strength between the layer B and the copper foil was 7 kN/m and the peel strength between the layer C and the copper foil was 0.9 kN/m, thereby confirming that the layers were closely adhered to each other sufficiently. On the other hand, in the laminate of Comparative Example 1, the peel strength between the film and the copper foil was insufficient at 3 kN/m.

What is claimed is:

1. A film that has a dielectric loss tangent of 0.005 or less, wherein the film includes a layer A and a layer B provided on at least one surface of the layer A,
wherein the layer A and the layer B each contain at least one polymer selected from the group consisting of a liquid crystal polymer, a fluorine-based polymer, a polymerized substance of a compound which has a cyclic aliphatic hydrocarbon group and a group having an ethylenically unsaturated bond, a polyphenylene ether, and an aromatic polyether ketone,
wherein an elastic modulus of a surface of the layer B at 160° C. is smaller than the elastic modulus of an inside of the film at 160° C.

2. The film according to claim 1,
wherein a loss tangent of the surface of the layer B at 160° C. is 0.03 or more.

3. The film according to claim 1,
wherein the elastic modulus of the inside of the film at 160° C. is 0.5 GPa or more.

4. A film that has a dielectric loss tangent of 0.005 or less,
wherein the film includes a layer A and a layer B provided on at least one surface of the layer A,
wherein the layer A and the layer B each contain at least one polymer selected from the group consisting of a liquid crystal polymer, a fluorine-based polymer, a polymerized substance of a compound which has a cyclic aliphatic hydrocarbon group and a group having an ethylenically unsaturated bond, a polyphenylene ether, and an aromatic polyether ketone,
wherein an elastic modulus of a surface of the layer B at 300° C. is smaller than the elastic modulus of an inside of the film at 300° C.

5. The film according to claim 4,
wherein a loss tangent of the surface of the layer B at 300° C. is 0.1 or more.

6. The film according to claim 4,
wherein the elastic modulus of the inside of the film at 300° C. is 0.1 GPa or more.

7. The film according to claim 1,
wherein a linear expansion coefficient is −20 ppm/K to 50 ppm/K.

8. The film according to claim 1,
wherein the film contains a filler.

9. The film according to claim 8,
wherein a number density of the filler is higher in layer A than layer B.

10. The film according to claim 1,
wherein the liquid crystal polymer has a constitutional unit represented by any of Formulae (1) to (3), $$—O—Ar^1—CO— \quad \text{Formula (1)}$$

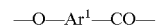

$$—CO—Ar^2—CO— \quad \text{Formula (2)}$$

$$—X—Ar^3—Y— \quad \text{Formula (3)}$$

in Formulae (1) to (3), $Ar^1$ represents a phenylene group, a naphthylene group, or a biphenylylene group, $Ar^2$ and $Ar^3$ each independently represent a phenylene group, a naphthylene group, a biphenylylene group, or a group represented by Formula (4), X and Y each independently represent an oxygen atom or an imino group, and hydrogen atoms in $Ar^1$ to $Ar^3$ may be each independently substituted with a halogen atom, an alkyl group, or an aryl group, $$—Ar^4—Z—Ar^5— \quad \text{Formula (4)}$$

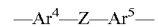

in Formula (4), $Ar^4$ and $Ar^5$ each independently represent a phenylene group or a naphthylene group, and Z represents an oxygen atom, a sulfur atom, a carbonyl group, a sulfonyl group, or an alkylene group.

11. A film that has a dielectric loss tangent of 0.010 or less,
wherein the film includes a layer A and a layer B provided on at least one surface of the layer A, and
wherein the layer A and the layer B each contain at least one polymer selected from the group consisting of a liquid crystal polymer, a fluorine-based polymer, a polymerized substance of a compound which has a cyclic aliphatic hydrocarbon group and a group having an ethylenically unsaturated bond, a polyphenylene ether, and an aromatic polyether ketone,
wherein:
an elastic modulus of a surface of the layer B at 160° C. is smaller than the elastic modulus of an inside of the film at 160° C.,
or
an elastic modulus of a surface of the layer B at 300° C. is smaller than the elastic modulus of an inside of the film at 300° C.

12. The film according to claim 1,
wherein the film further includes a layer C, and
the layer B, the layer A, and the layer C are provided in this order.

13. A laminate comprising:
the film according to claim 12;
a metal layer disposed on a surface of the layer B side in the film; and
a metal layer disposed on a surface of the layer C side in the film.

14. The laminate according to claim 13,
wherein the metal layer disposed on the surface of the layer C side is a copper layer disposed on the surface of the layer C, and
a peel strength between the layer C and the copper layer disposed on the surface of the layer C side is 0.5 kN/m or more.

15. A laminate comprising:
the film according to claim 1; and
a metal layer disposed on a surface of the layer A side in the film.
16. The laminate according to claim 15,
wherein a thickness of the layer B is larger than a thickness of the metal layer.
17. A laminate comprising:
the film according to claim 1; and
a metal layer disposed on a surface of the layer B side in the film.
18. The laminate according to claim 17,
wherein the metal layer disposed on the surface of the layer B side is a copper layer disposed on the surface of the layer B, and
a peel strength between the layer B and the copper layer is 0.5 kN/m or more.

\* \* \* \* \*